US008622764B2

(12) United States Patent
Aoki et al.

(10) Patent No.: US 8,622,764 B2
(45) Date of Patent: Jan. 7, 2014

(54) INTEGRATED TRANSLATIONAL LAND-GRID ARRAY SOCKETS AND LOADING MECHANISMS FOR SEMICONDUCTIVE DEVICES

(75) Inventors: Russell S. Aoki, Tacoma, WA (US); Anthony P. Valpiani, Graham, WA (US); Barry T. Dale, DuPont, WA (US); Chia-Pin Chiu, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 421 days.

(21) Appl. No.: 13/024,032

(22) Filed: Feb. 9, 2011

(65) Prior Publication Data
US 2012/0200993 A1 Aug. 9, 2012

(51) Int. Cl.
*H01R 13/625* (2006.01)
(52) U.S. Cl.
USPC .......................................... 439/342; 439/862
(58) Field of Classification Search
USPC ................................ 439/70–73, 66, 342, 862
See application file for complete search history.

(56) References Cited

U.S. PATENT DOCUMENTS

| 6,450,825 | B1 | 9/2002 | Huang et al. |
| 6,676,429 | B1 | 1/2004 | Mchugh et al. |
| 6,722,909 | B1 | 4/2004 | Mchugh et al. |
| 7,692,281 | B2 | 4/2010 | McAlonis et al. |
| 8,142,216 | B1 * | 3/2012 | Xiao et al. ..................... 439/342 |
| 8,202,109 | B2 * | 6/2012 | Zhou et al. ..................... 439/342 |
| 8,287,296 | B2 * | 10/2012 | Polnyi ............................ 439/342 |
| 2004/0067672 | A1 | 4/2004 | Ma et al. |

FOREIGN PATENT DOCUMENTS

WO 2012/108944 A2 8/2012

OTHER PUBLICATIONS

International Search Report and Written Opinion received for PCT Patent Application No. PCT/US2011/067509, mailed on Sep. 26, 2012, 8 pages.

* cited by examiner

*Primary Examiner* — Khiem Nguyen
(74) *Attorney, Agent, or Firm* — International IP Law Group, P.L.L.C.

(57) ABSTRACT

A land-grid array die package socket is configured for low- or zero insertion-force assembly with a land-grid array die package. For zero insertion-force assembly, a motion plate applies a force on a land-grid array contact that causes a contact tip to move into protective cover while the die package is inserted into the socket. After zero insertion-force assembly, the motion plate applies a force on the land-grid array contact that causes the contact tip to deflect in a positive-Z direction until a useful contact is made at the contact tip with a land-grid array pad.

16 Claims, 17 Drawing Sheets

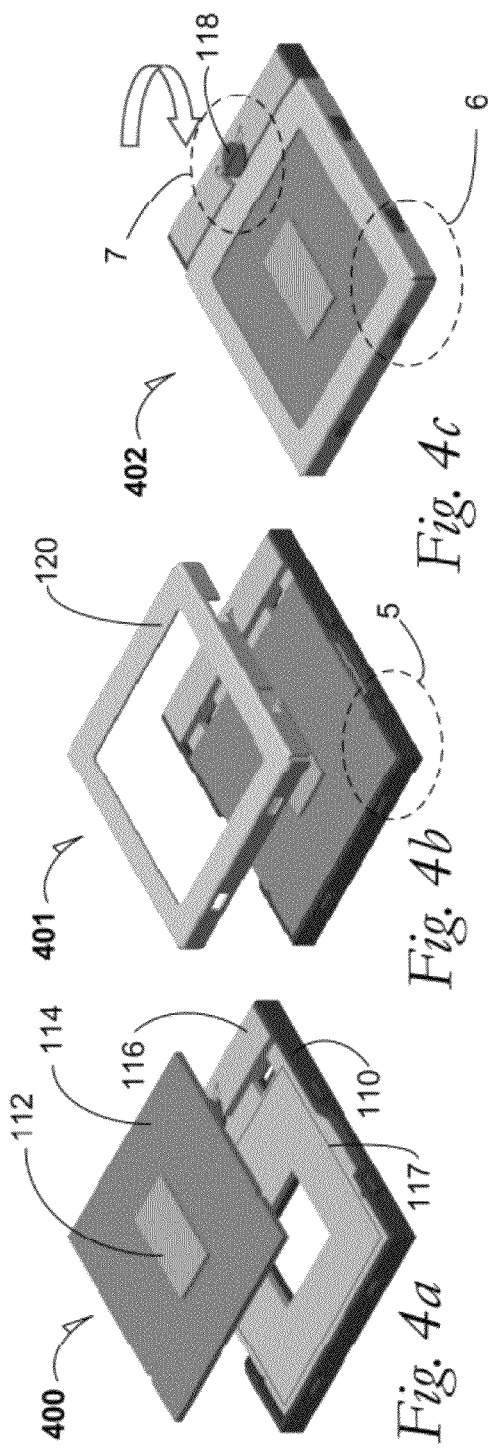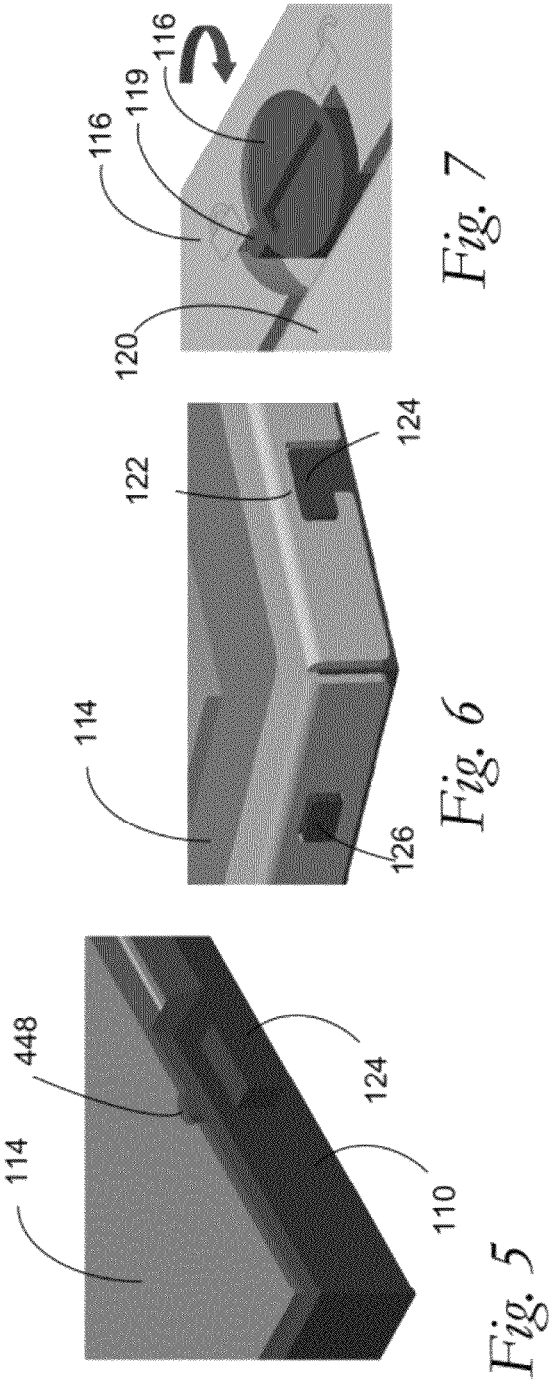

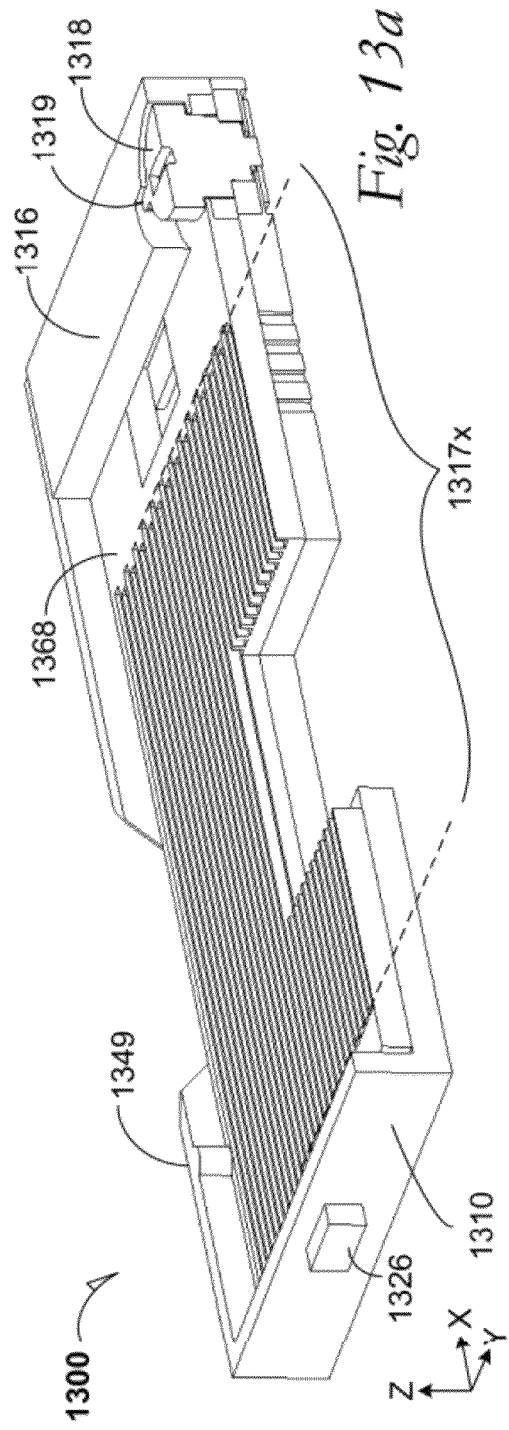
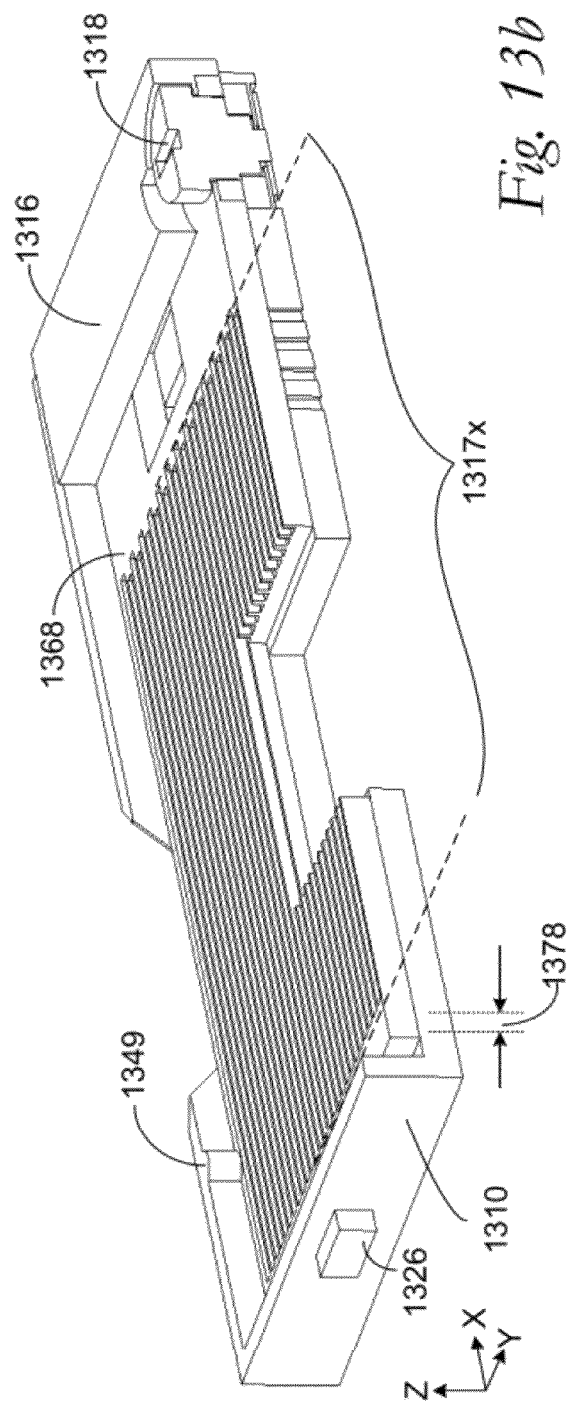

INTEGRATED TRANSLATIONAL LAND-GRID ARRAY SOCKETS AND LOADING MECHANISMS FOR SEMICONDUCTIVE DEVICES

Disclosed embodiments relate to integrated zero-insertion-force sockets and loading mechanisms for land-grid array die packages containing semiconductive devices.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIG. 2a is a detail section taken from a cross-section elevation depicted in FIG. 2 according to an embodiment;

FIG. 4a is an exploded perspective of a portion of the low- or zero-insertion-force assembly of a of an LGA die package during assembly according to an example embodiment;

FIG. 4b is an exploded perspective of the low- or zero-insertion-force assembly of the die package depicted in FIG. 4a after further activity according to a method embodiment;

FIG. 4c is a perspective elevation of the low- or zero-insertion-force assembly of the die package depicted in FIG. 4b after further activity according to an embodiment;

FIG. 5 is a detail section elevation taken from FIG. 4b according to an embodiment;

FIG. 6 is a detail section elevation taken from FIG. 4c according to an embodiment;

FIG. 7 is a detail section elevation taken from FIG. 4c according to an embodiment;

FIG. 13a is a cut-away perspective elevation of a cam screw being rotated in a socket body and translating a cam plate according to an example embodiment;

FIG. 13b is a cut-away perspective elevation of the die-package socket depicted in FIG. 13a after further activity according to an embodiment;

DETAILED DESCRIPTION

Land-grid array (LGA) sockets and LGA die packages are configured in assemblies that allow a low or a zero insertion-force (ZIF) methods of coupling the sockets to the chip packages. In an embodiment, a translational motion is achieved on a portion of the socket that causes positive-Z displacement of at least a portion of the LGA contact such that it achieves a sufficient normal force on the LGA pad that is on the LGA chip package. Before insertion of the LGA chip package, the LGA contact tip is protected from incidental damage such as bent contacts. The contact tip is deflected in a negative-Z displacement into protective cover, followed by ZIF insertion of the LGA chip package.

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings.

Figure 1:
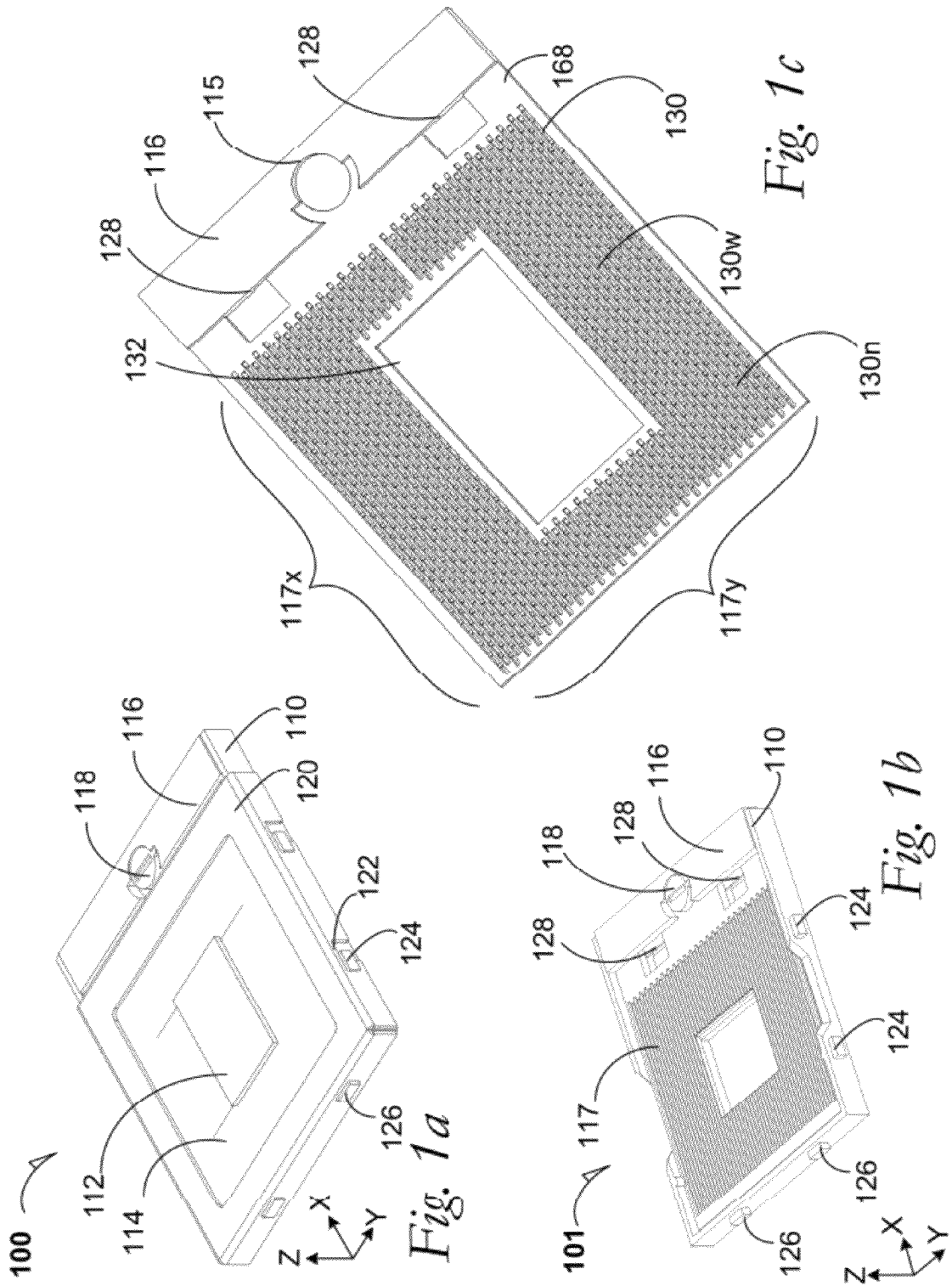
FIG. 1a is a perspective elevation of an land-grid array (LGA) die package socket for low- or zero insertion-force die mounting according to an example embodiment.
FIG. 1b is a perspective elevation of a portion of the LGA die-package socket depicted in FIG. 1a according to an embodiment.
FIG. 1c is a perspective elevation of the motion plate depicted in FIG. 1b according to an embodiment.

FIG. 1a is a perspective elevation of a die-package socket 100 for zero insertion-force chip (ZIF) mounting according to an example embodiment. A socket body 110, also referred to as a socket housing 110, has been assembled with a bare die package that includes a bare die 112 and a land-grid array (LGA) die package 114 that includes LGA pads on the secondary side thereof (see FIG. 3). In an embodiment, the bare die 112 has a thickness in a range from 0.25 mm to 1 mm. In an embodiment, the bare die 112 has a thickness of 0.5 mm. In an embodiment, the LGA die package 114 has an 8-layer thickness that pins out at an LGA. In an embodiment, the LGA die package 114 has a 10-layer thickness that pins out at an LGA. Other thicknesses may be used in the LGA die package as is discussed with respect to FIGS. 10d and 10e.

A motion plate 116 has also been assembled to the socket body 110. In an embodiment, the motion plate 116 is a cam-actuated plate 116 and a cam screw 118 applies a lateral force to the cam plate 116 such that the cam plate 116 moves laterally in the positive- and negative X-directions. Hereinafter, motion plate embodiments will be referred to as, e.g., a "cam plate 116" but it is understood that other methods of translational motion may be applied to a motion plate.

The die-package socket 100 is used with a primary stiffener 120 that is assembled to the socket body 110 such as by locking flange channels 122 of the primary stiffener 120 into a locking configuration with socket-body channel flanges 124 as well as threading the primary stiffener 120 onto end flanges 126. The primary stiffener 120 may also be referred to as a clip 120. In an embodiment, the primary stiffener 120 is made of a stainless steel and has a thickness of about 0.5 mm.

FIG. 1b is a perspective elevation of a portion of the ZIF die-package socket depicted in FIG. 1a according to an embodiment. The die-package socket 101 has been exposed by removal of the primary stiffener 120 and the LGA die package 114 such that the cam plate 116 has been exposed. A LGA-contact array 117 is exposed as part of the cam plate 116. The LGA-contact array 117 may also be the approximate footprint for a semiconductive device such as the bare die 112 and for a mounting substrate such as the LGA die package 114. In an embodiment, the LGA-contact array 117 has a plurality of perforations (see FIG. 1c) that accommodate a plurality of LGA contact embodiments. Additionally, the cam plate 116 has two receptacles 128 for primary stiffener tabs 246 (see FIG. 2 at 202) that are part of the primary stiffener 120 to facilitate sliding and locking the primary stiffener 120 into place. The tabs 246 are used to complement Z-direction stress encountered by the primary stiffener 120 at the end flanges 126.

FIG. 1c is a perspective elevation of the cam plate depicted in FIG. 1b according to an embodiment. The cam plate 116 is illustrated with the cam screw 118 (see FIG. 1b) removed to reveal a cam-screw fitting 115. The LGA-contact array 117 is depicted in both the X-dimension 117x and the Y-dimension 117y and a plurality of LGA contact slots is depicted in the array 117, one of which is indicated with numeral 130. Each contact slot 130 is found within plurality of array prominences each of which defines a boundary between two adjacent rows of LGA contact slots. The prominences are coplanar with an upper surface 168 of the cam plate 116.

In an embodiment, the cam plate 116 has a geometry that provides unique lateral displacement to each LGA contact to distribute loading across the LGA pads as needed. In an embodiment, the contact slot 130 has a first dimension. In an embodiment, a second contact slot 130n has a second dimension that is narrower than the first dimension. In an embodiment a subsequent contact slot 130w has a subsequent dimension that is wider than the first dimension. Different dimension contact slots allow for different resultant normal forces by selected LGA contacts that are deployed together in the array 117. It may now be understood that more than three contact slot dimensions may be employed depending upon a given useful application.

In an embodiment, the LGA-contact array includes 24 perforations in the X dimension 117x and 51 perforations in the Y dimension 117y for a total of about 960 perforations (with the center 132 being open). Other array dimensions may be configured based upon a given application of a ZIF die-package socket embodiment. In an embodiment, the cam plate 116 is made of a material that has an E modulus of 11 giga Pascal (GPa) and a yield stress in a range from 110 to 200 mega Pascal (MPa).

Figure 2:
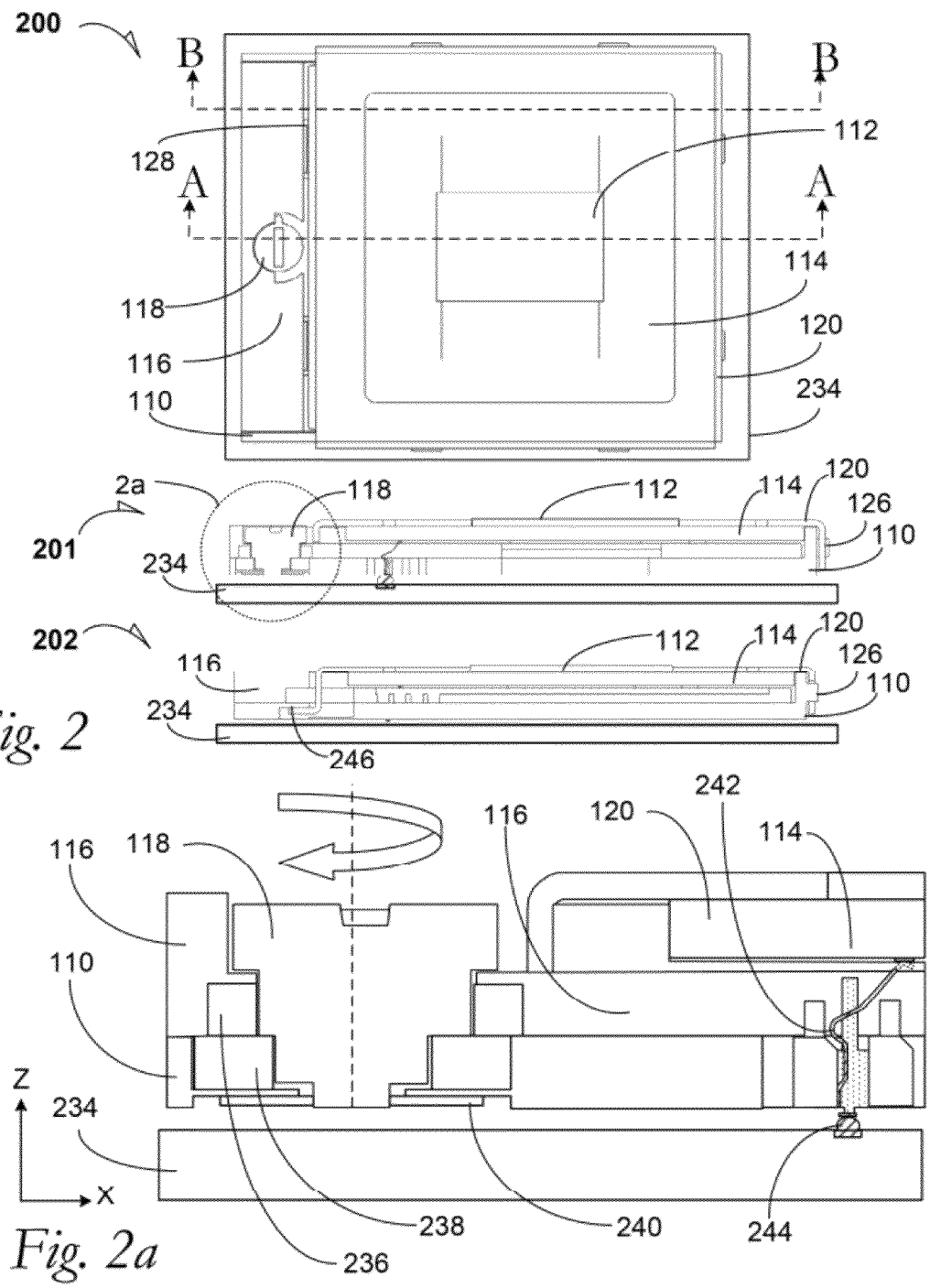
FIG. 2 includes a top plan view and two cross-section elevations of an LGA die-package socket for low- or zero insertion-force chip mounting according to an example embodiment.

FIG. 2 includes a top plan view and two cross-section elevations of a die-package socket for zero insertion-force chip mounting according to an example embodiment. The die-package socket 200 includes a motherboard 234 upon which a socketed bare die 112 is mounted along with an LGA die package 114. Structures depicted in FIGS. 1a, 1b, and 1c are also illustrated in FIG. 2.

At the section line A-A, the LGA die-package socket 201 is seen in cross section to include the cam screw 118 as it is coupled to the cam plate 116 and as it is affixed to the socket body 110.

FIG. 2a is a detail section taken from a cross-section elevation depicted in FIG. 2 at 201 according to an embodiment. The cam screw 118 is coupled to the cam plate 118 by interfacing with a cam-plate stiffener 236. The cam plate 216 is slidingly coupled to the socket body 210 and the cam plate 216 and the socket body 210 are rotatingly coupled to the cam screw 218.

During rotation of the cam screw 118 about the rotational axis, the cam screw 218 moves eccentrically and causes the cam-plate stiffener to distribute a lateral force into the cam plate 116. In an embodiment, the cam screw 118 has a radius in a range from 1.75 mm to 2.25 mm with an offset of 0.35 mm. The cam screw 118 also interfaces with a socket-body stiffener 238, which may also be referred to as a housing stiffener 238. The cam screw 118 is further affixed to the socket body 110 by a cam-screw retainer clip 240. The cam-screw retainer clip 240 may be an expansion ring that is friction fixed to the cam screw 118 according to an example embodiment.

An LGA contact 242 is also depicted as being affixed to the socket body 110 as well as perforating the cam plate 116. In an embodiment, the cam screw 118 delivers a 100 lbf lateral force upon the cam plate to achieve a 0.4 mm deflection of the tip of the LGA contact 242 by a quarter turn of the cam screw 118.

Figure 8:
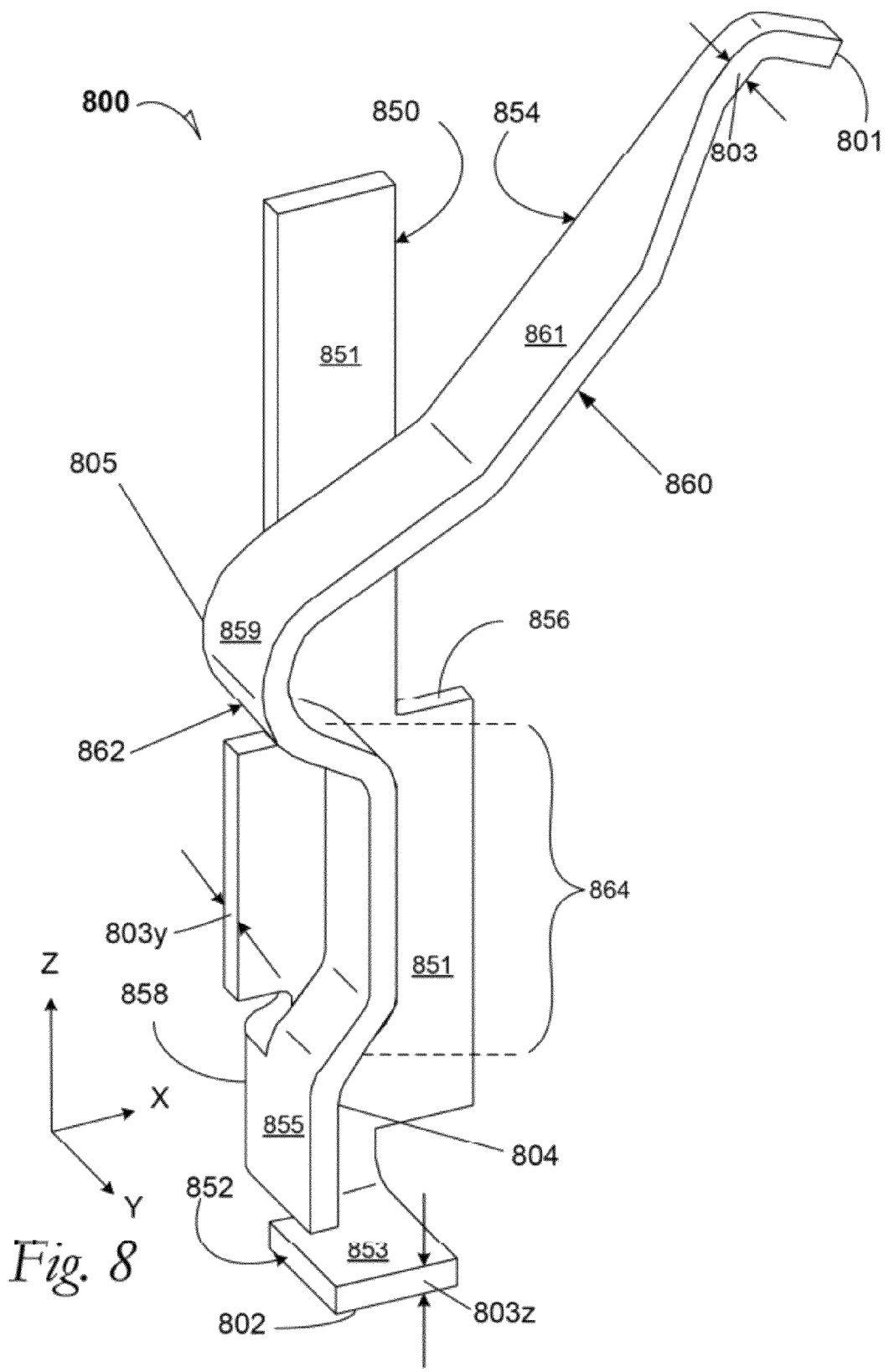
FIG. 8 is a perspective elevation of a land-grid array contact used in a translational land-grid array connector according to an example embodiment.

The LGA contact 242 is further described in FIG. 8. The LGA contact 242 makes electrical contact with a solder ball 244 that is in electrical contact with the motherboard 234. By rotating the cam screw 118 (as illustrated by the left-torque directional arrow), the cam screw may shift the cam plate 116 such that the LGA contact 242 is deflectable in the positive-Z and the negative-Z directions according to a given utility during ZIF insertion of the LGA die package 114, as well as making electrical contact upon the LGA that is on the secondary side of the LGA die package 114 as further illustrated herein.

At the section line B-B, the LGA die-package socket 202 is seen in cross section to include a primary stiffener tab 246 that is first inserted into the receptacle 128 as illustrated at 200. The primary stiffener tab 246 is countered in force at the end flange 126.

Figure 3:
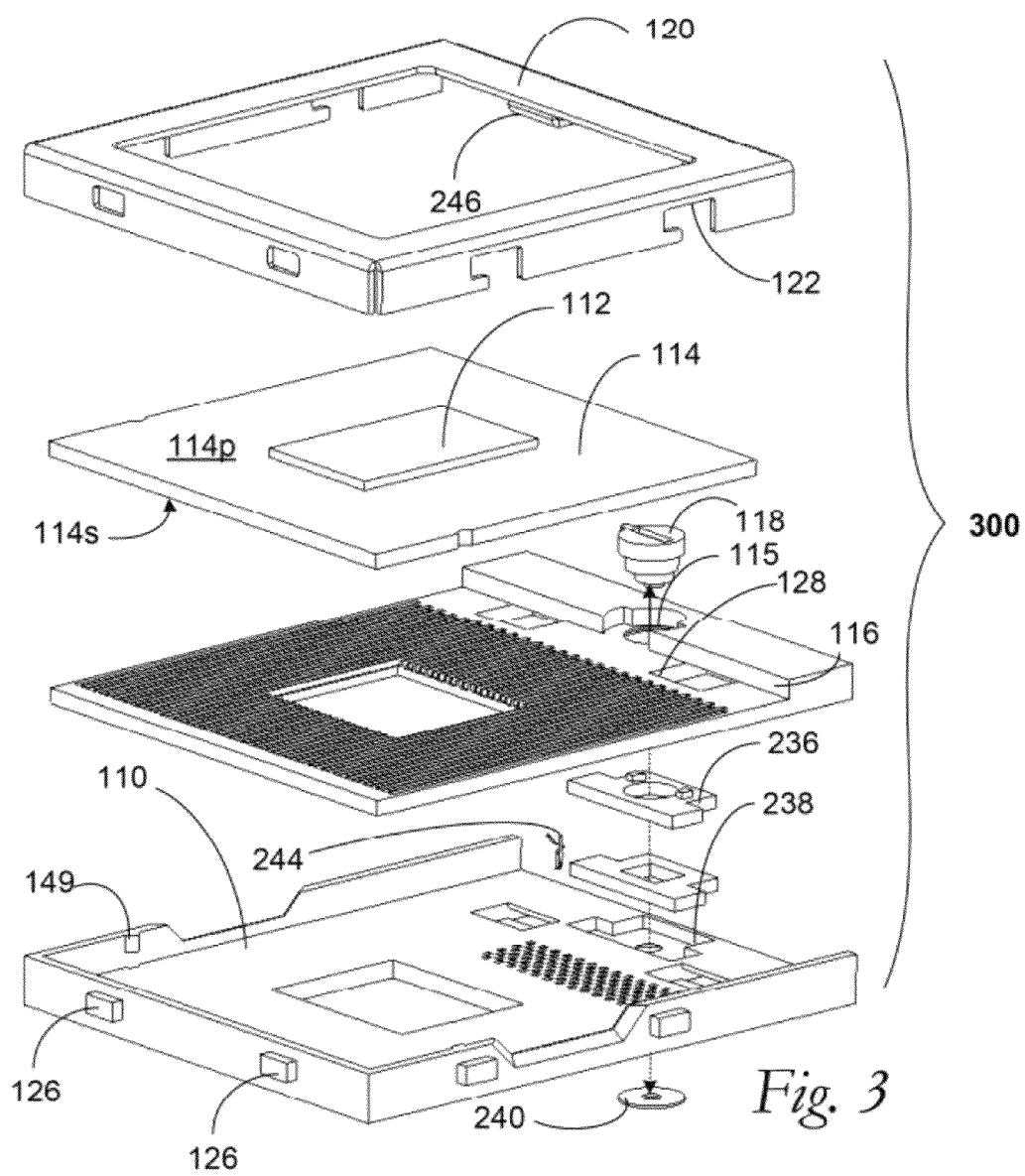
FIG. 3 is an exploded perspective of an LGA die-package socket for low- or zero insertion-force chip mounting according to an example embodiment according to an example embodiment.

FIG. 3 is an exploded perspective of an LGA die-package socket 300 for zero insertion-force chip mounting according to an example embodiment according to an example embodiment. In an embodiment, assembly of the socket 300 includes first affixing the socket-body stiffener 238 to the socket body 110. Next, the cam-plate stiffener 236 is coupled with the cam plate 116 from below. Next, the cam screw 118 is inserted into the cam-screw fitting 115 and contacts bearing areas of the cam-plate stiffener 236. The cam-screw retainer clip 240 is affixed at the bottom of the cam screw 118 to hold the enumerated structures together.

In an embodiment, the stitching operation is first done by stitching the LGA contacts 244 into the socket body 110, followed by assembling the cam plate 116 to the socket body 110. In an embodiment, the stitching operation is done by first assembling the cam plate 116 to the socket body 110, followed by stitching the LGA contacts 244 into the socket body 110 by completely penetrating the cam plate 116 with a portion of the LGA contacts 244. In this embodiment, stitching of the plurality of LGA contacts 244 is done after assembling items 110, 116, 118, 236, 238, and 240.

The bare die 112 is mounted on the LGA die package 114. In an embodiment, the LGA die package 114 includes a primary side 114p that supports the bare die 112, and a secondary side 114s, upon which an LGA is deployed that interfaces with a plurality of LGA contact 244 embodiments that have been stitched to the socket body 110. Thereafter, the primary stiffener 120 is inserted into the receptacles 128 at the primary stiffener tabs 246, and the locking flange channels 122 lock onto the channel flanges 124 and onto other flanges. In an embodiment when the LGA die package is seated on the cam plate 116, the seating plane of the top surface of the cam plate 116 is about 3 mm above a motherboard.

FIG. 4a is an exploded perspective of a portion of the zero-insertion-force assembly of a of an LGA die-package socket 400 during assembly according to an example embodiment. The bare die 112 that is mounted on the LGA die package 114 is shown being matched to the footprint 117 on the cam plate 116. As will be illustrated, the plurality of LGA contacts are first configured in a negative-Z displacement into protective cover below prominences (top surfaces) on the surface of the cam plate 116. As such, a ZIF mounting of the LGA die package 114 with the bare die 112 is accomplished.

FIG. 4b is an exploded perspective of the zero-insertion-force assembly of the LGA die-package socket depicted in FIG. 4a after further activity according to a method embodiment. The LGA die-package socket 401 is being restrained by with primary stiffener 120 as it is being fitted over the bare die 112 and the LGA die package 114.

FIG. 5 is a detail section elevation 5 taken from FIG. 4b according to an embodiment. The LGA die package 114 has a concave fiducial 448 that mates to a convex fiducial on the socket body 110 and allows land-grid array on the secondary side 114s of the LGA die package 114 to align with the tips of LGA contacts that are nestled in the cam plate.

FIG. 4c is a perspective elevation of the zero-insertion-force assembly of the LGA die-package socket depicted in FIG. 4b after further activity according to an embodiment. The LGA die-package socket 402 is seen with the primary stiffener 120 having been assembled to the socket body 110 such that the LGA die package 114 has been aligned as well as restrained. Further connecting of the bare die 112 to the LGA contacts is done by rotating the cam screw 118. By rotating the cam screw 118, the motion plate 116 moves in the X direction and as will be further disclosed, the plurality of LGA contacts are deflected in a positive-Z direction to make contact with the LGA lands on the secondary side 114s of the LGA die package 114.

FIG. 6 is a detail section elevation taken from FIG. 4c according to an embodiment. The primary stiffener 120 has been channel locked onto the housing channel flanges 124 as well as fitted over the end flanges 126. In combination with alignment of the fiducials 448 with the fiducials on the socket body 110, the LGA die package 114 is prepared for connection with the LGA contacts.

FIG. 7 is a detail section elevation taken from FIG. 4c according to an embodiment. The cam screw 118 is shown as a circular structure with a tab 119 that allows a 180° rotation capability between locked, LGA-contact-retracted, intermediate, and unlocked positions. In an embodiment, more than two positions may be used to achieve different Z-height states for the LGA contacts as is further disclosed herein.

FIG. 8 is a perspective elevation of an LGA contact 800 used in a translational land-grid array connector according to an example embodiment. The LGA contact 800 is manufactured from a metal strip by stamping and bending according to an embodiment. The LGA contact 800 may be made from copper or a copper alloy. Other metals may be used for the LGA contact 800. The LGA contact 800 includes three main portions including a carrier attach 850, a contact paddle 852, and a contact body 854. Additionally, the LGA contact 800 has a contact tip at a first end 801 and a contact paddle 852 at a second end 802. Other features are delineated below. The contact paddle 852 may also be referred to as a lead portion as it makes contact with an electrical bump. The contact paddle is also compliantly integral to the plate 856 portion of the carrier attach 850.

The carrier attach 850 occupies a major dimension in the Z-direction, a medium dimension in the X-direction, and a minimum dimension $803y$ in the Y-direction. It can be seen, however, that the contact tip 801 has a medium dimension that is similar to the minimum dimension 803 since the ribbon shape may be narrowed according to useful embodiments.

The carrier attach 850 generally has a carrier-attach surface 851 that lies in an X-Z plane as depicted. The carrier attach 850 has a socket-body plate 856 that is used to secure the LGA contact 800 to a socket body such as the socket body 110 depicted herein.

The contact paddle 852 has been bent out of the plane of the carrier attach 850 and it occupies a minimum dimension $803z$ in the Z-direction. The contact paddle is connected to- and integral with the carrier attach 850. The contact paddle 852 generally has a contact-paddle surface 853 that lies in an X-Y plane. In an embodiment, the contact paddle 852 is assembled to a solder ball such as the solder ball 244 depicted in FIG. 2a that is in electrical contact with the motherboard 234.

The contact body 854 has been bent out of the plane of the carrier attach 850 and has a ribbon shape with several other bends that are employed for achieving useful contact with an LGA pad on an LGA-die package such as the LGA die package 114. The contact body 854 has a primary bend 858 where it connects to and is integral with the carrier attach 850. The contact body 856 begins at the primary bend 858 with a base surface 855 that occupies a Y-Z plane. The "ribbon shape" of the contact body 854 may be understood to be a structure that has a major dimension, a medium dimension, and a minimum dimension 803 where the major dimension is several times greater than that of the medium dimension. For the contact body 854, the major dimension begins at the base surface 855 and ends at the contact tip 801. The medium dimension is seen in the Y-direction, and the minimum dimension 803 is indicated near the contact tip 801 but it occupies the length of the major dimension. The minimum dimension 803 can be seen along the length of the LGA contact body 854, but the medium dimension near the contact tip 801 has been tapered. The contact body 854 may also be referred to as a tine 854.

During LGA-contact operation, the LGA contact 800 primarily pivots at a primary pivot area 804 in the contact body 854. To make contact of the contact tip 801 with a pad of an LGA, a first displacement input 860 is applied at a first-displacement surface 861 that is adjacent the contact tip 801 to cause a positive-Z displacement of the contact tip 801. The first-displacement surface 861 is substantially planar, but it may be otherwise depending upon a given useful application. During ZIF mounting of an LGA-die package, the contact body 854 receives a pre-ZIF displacement input 862 at a secondary pivot area 805 that includes a curvilinear surface 859 according to an embodiment.

Other shapes and structures are seen in the contact body 854 including a U-bend 864 that adds useful overall flexibility thereto as well as compact size.

Figure 9:
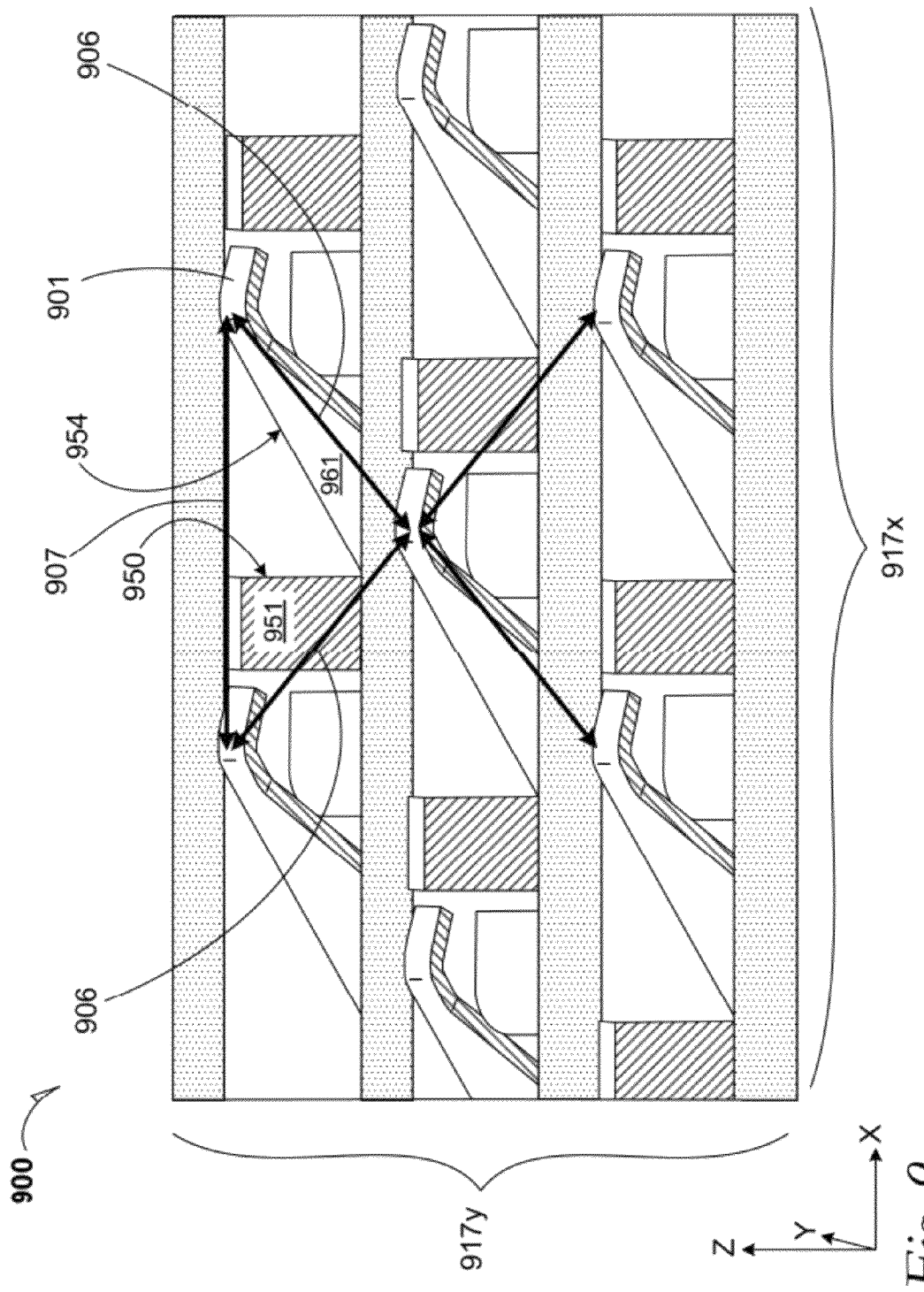
FIG. 9 is a detail of translational land-grid array contacts that are arrayed in a motion plate according to an example embodiment.

FIG. 9 is a detail of translational land-grid array contacts that are arrayed in a cam plate according to an example embodiment. A plurality of LGA contacts are depicted in an LGA contact array that has both an X dimension 917*x* and a Y dimension 917*y*. One LGA contact 954 is depicted along with portions of six other LGA contacts. The LGA contact that is labeled is shown in part including being labeled at a carrier attach 950 and a contact body 954. The carrier attach 950 has a carrier-attach surface 951 that lies in an X-Z plane as depicted. The contact body 954 includes a contact tip 901 and it is pitched away from the carrier attach 950. The contact body 954 also includes a first-displacement surface 961 that is adjacent the contact tip 901 to facilitate both negative- and positive-Z displacement of the contact tip 901 depending upon the method being used. Layout of the LGA contacts is done in a 1 mm diagonal pitch 906 and an X-direction spacing 907 of 1.41 mm. The pitch and the spacing may be driven by actual translation embodiment achieved by rotating the cam screw or other methods of translating the motion plate. As depicted, seven contact tips are configured with one LGA contact in the middle of the pattern. In an embodiment, a square-pitch array is used. In an embodiment, an hex-pitch array is used.

Figure 10A:
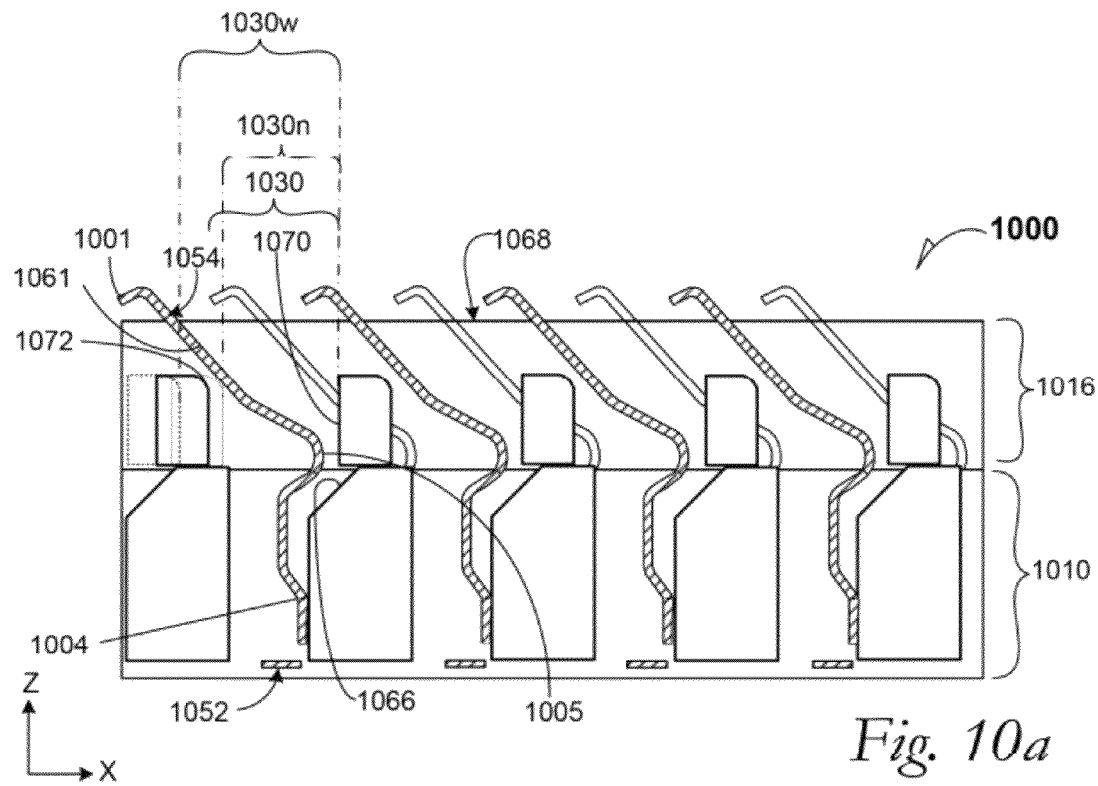
FIG. 10a is a side cut-away elevation of an array of land-grid array contacts during a low-insertion-force assembly of a chip package according to an example embodiment.

FIG. 10*a* is a side cut-away elevation of an array of land-grid array contacts during a low-insertion-force assembly of a translational LGA die-package socket 1000 according to an example embodiment. "Low insertion force assembly" of an LGA die package may be understood to placing the LGA die package upon the contact tips 1001, followed by applying an increased normal force such as by translational motion of a cam plate.

A socket body 1010 is disposed below a cam plate 1016. Portions of a ZIF socket 1000 embodiment are depicted including a plurality of LGA contacts, one of which is indicated with numeral 1054 at the contact body 1054. The LGA contact has been stitched though a contact slot 1030 in the cam plate 1016 and further into the socket body 1010. In an embodiment, each individual contact slot 1030 can be tailored in width such that the normal force for each LGA contact tip may be customized for a given application. In an embodiment, the contact slot is widened as contact slot 1030*w* to allow for a lower normal force than a contact slot otherwise not widened. In an embodiment, the contact slot is narrowed as contact slot 1030*n* to allow for a higher normal force than a contact slot otherwise not narrowed. It may now be seen that the cam slot 1030 has a first dimension 1030 and a subsequent cam slot 1030*w* has a subsequent dimension 1030*w* that is larger than the first dimension. It may be appreciated that multiple cam slots may be arrayed in the cam plate with first- second- and subsequent dimensions that are all different from each other.

The lead portion 1052 and the LGA contact body 1054 are illustrated. The LGA contact body 1054 includes a primary pivot area 1004 and a secondary pivot area 1005.

Also, the contact paddle 1052 is seen, but the carrier attach has been removed for illustrative clarity. The socket body 1010 is depicted into which the carrier-attach has been inserted. The socket body 1010 has an urging seat 1066 that generally is useful for clearance of the LGA contact body 1054 at the secondary pivot area 1005.

The LGA contact body 1054 is depicted in repose (a natural position) such that it is in a minimal-stress state and the contact tip 1001 is slightly above a top surface 1068 of the motion plate 1016. The motion plate 1016 also has an urging wall 1070 that engages the LGA contact body 1054 during an operation to lower the Z-height of the contact tip 1001. Similarly, the cam plate 1016 has an urging shoulder 1072 that is part of a structure that engages the LGA contact body 1054 by using a first displacement input that is applied at a first-displacement surface 1061 that is adjacent the contact tip 1001 to cause a positive-Z displacement of the contact tip 1001. The top surface 1068 is also referred to as an array prominence such that each contact slot (e.g. contact slot 130 depicted in FIG. 1*c*) is found within a plurality of array prominences each of which defines a boundary between two adjacent rows of LGA contact slots. As such, the contact tip 1001 is allowed to be deflected below the array prominence 1068.

Figure 10B:
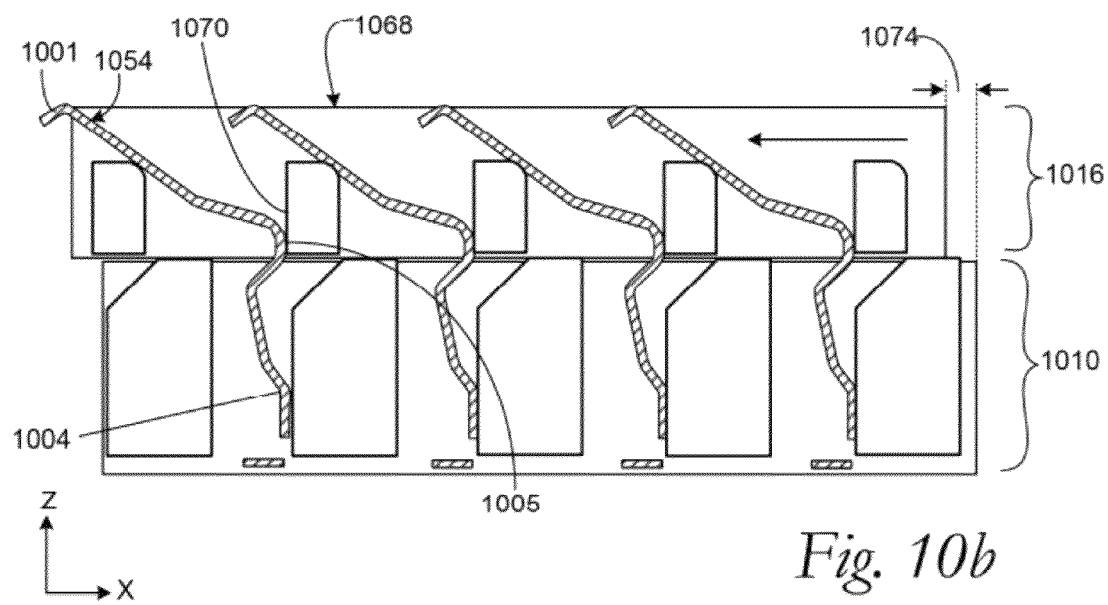
FIG. 10b is a side cut-away elevation of the array of land-grid array contacts depicted in FIG. 10a for a zero insertion force assembly after further activity according to an example embodiment.

FIG. 10*b* is a side cut-away elevation of the array of land-grid array contacts depicted in FIG. 10*a* for a zero insertion force assembly after further activity according to an example embodiment. The enumerated LGA contact body 1054 exhibits a lower Z-height at the contact tip 1001 because the cam plate 1016 has shifted left as indicated by the directional arrow. The distance 1074 of the shift is sufficient such that the urging wall 1070 has engaged the LGA contact body 1054 at the secondary pivot area 1005. The LGA contact body 1054 has hinged by torsion at the primary pivot area 1004 and the contact tip 1001 has moved in the negative-Z direction such that it is in protective cover below the top surface 1068 of the cam plate 1016.

Figure 10C:
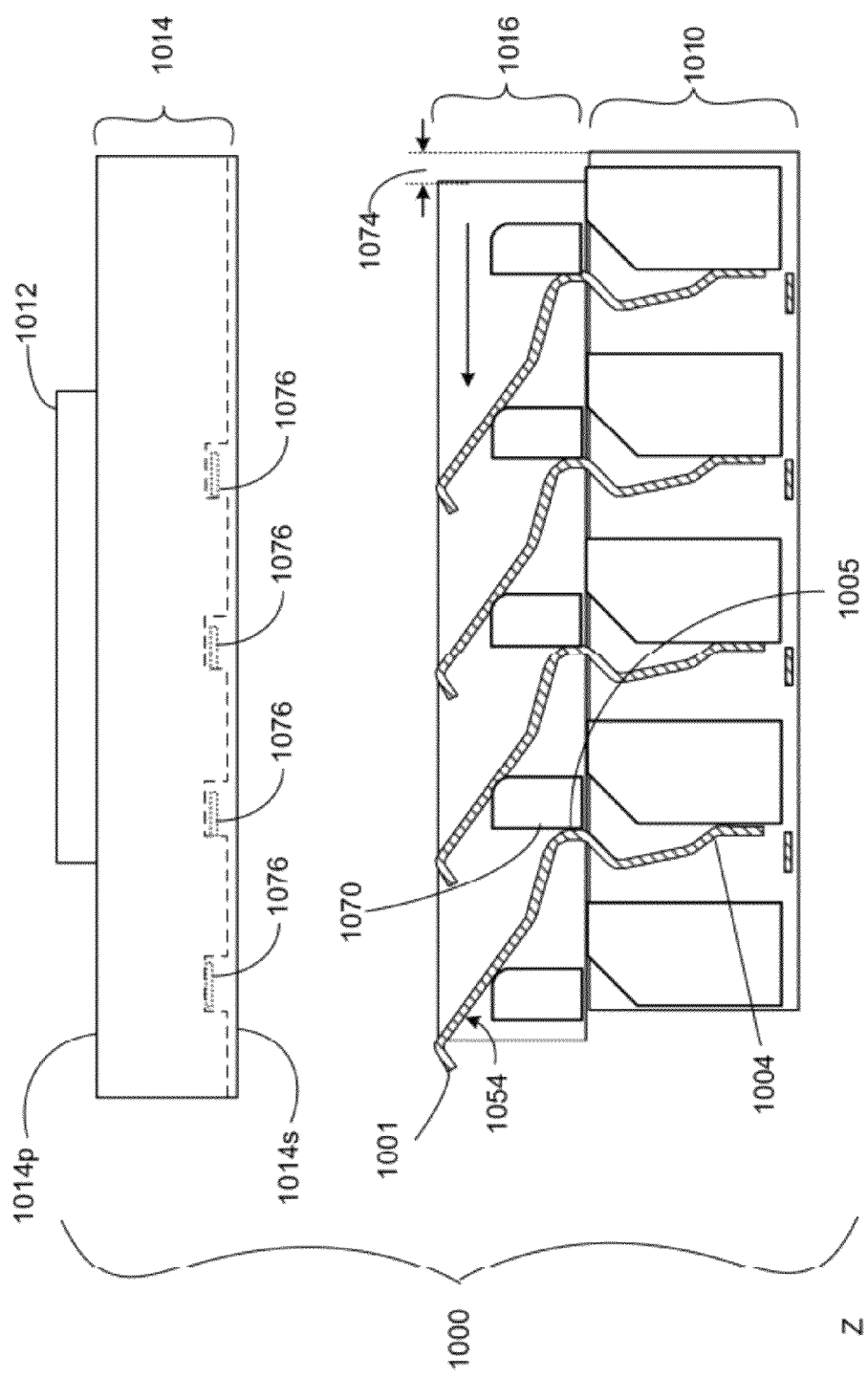
FIG. 10c is a side cut-away elevation of the array of land-grid array contacts depicted in FIG. 10b after further activity according to an example embodiment.

FIG. 10*c* is a side cut-away elevation of the array of land-grid array contacts depicted in FIG. 10*b* after further activity according to an example embodiment. During a ZIF operation, such as the zero-insertion-force assembly of the LGA-die package 400 depicted in FIG. 4*a*, the contact tip 1001 is lowered into protective cover below the top surface 1068. In FIG. 4*a*, the die package 414 is being inserted onto the LGA-contact array 117 with "zero insertion force" as the contact tips have been retracted below cover of the motion plate 116. Similarly illustrated in FIG. 10*c*, an LGA-die package 1014 is matched to the footprint on the cam plate 1016 and the plurality of LGA contacts are first configured into a negative-Z displacement into protective cover below prominences (top surfaces 1068) on the surface of the cam plate 1016. The LGA-die package 1014 supports a bare die 1012 and the LGA-die package 1014 includes a primary side 1014*p*, which supports the bare die 1012, and a secondary side 1014*s*, which deploys an LGA. Four LGA pads 1076 are depicted in phantom lines upon the secondary side 1014*s*. The number of LGA pads 1076 is depicted as four for simplicity, but in an embodiment the number may be on the order of one thousand such as total of about 960 to match a given number of perforations in a socket body as well as an equal number of LGA contacts that have been stitched into the socket body 1010.

It can be seen that by lowering the Z-height of each contact tip 1001, the likelihood of bending any given contact tip 1001 has been reduced. By the same token, because the contact tips 1001 are protected, ZIF assembly of a die package to a motion plate is more standardized with a reduced likelihood of contact tips being exposed to damage by each insertion and extraction of an LGA die package 1014 onto a socket such as the cam plate 1016 and the socket body 1010.

Figure 10D:
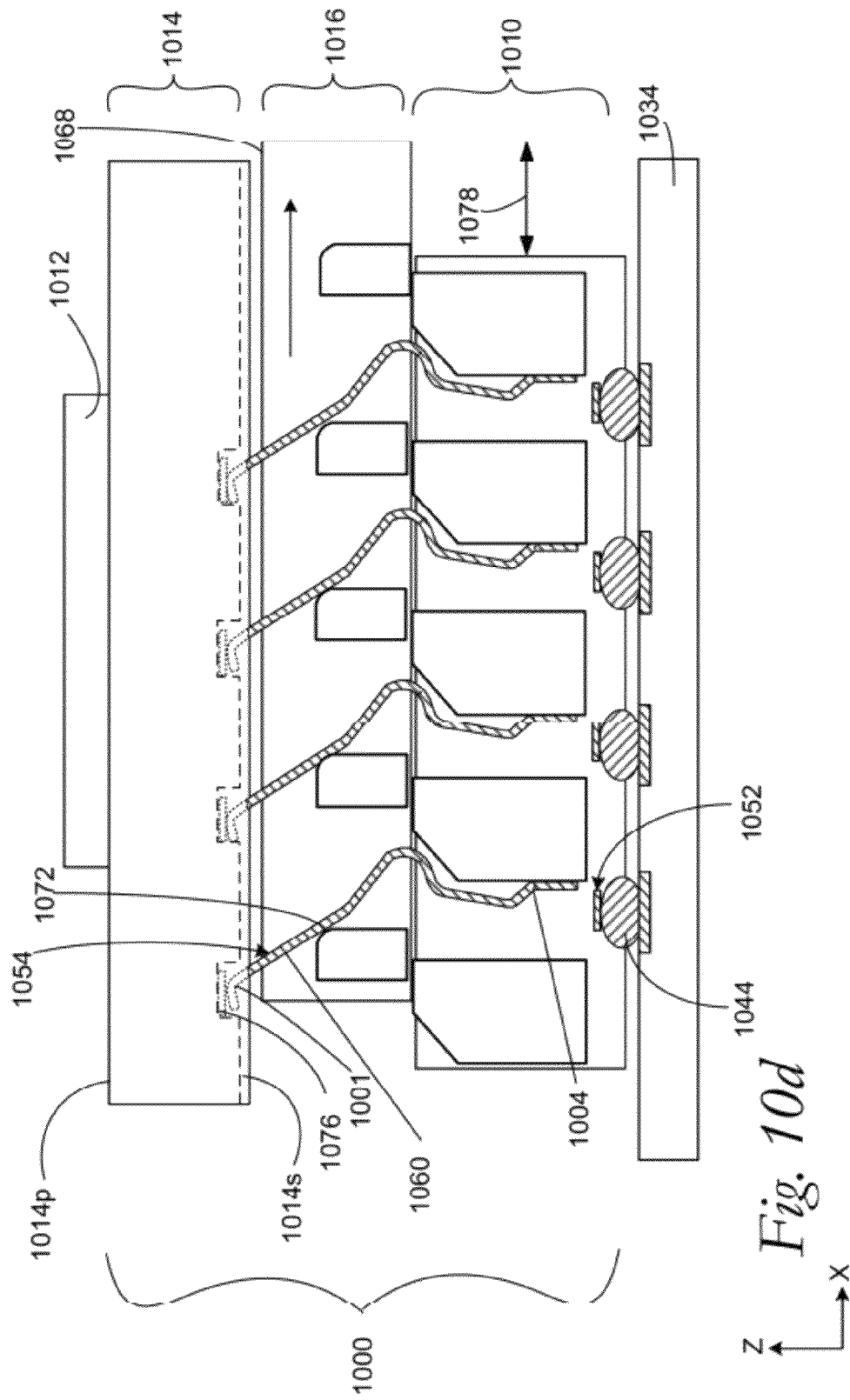
FIG. 10d is a side cut-away elevation of the array of land-grid array contacts depicted in FIG. 10c after further activity according to an example embodiment.

FIG. 10d is a side cut-away elevation of the array of land-grid array contacts depicted in FIG. 10c after further activity according to an example embodiment. After the LGA-die package 1014 has been seated upon or near the top surface 1068 of the cam plate 1015, the cam plate 1016 may be shifted to the right by a distance 1078 such that the tip 1001 of the LGA contact body 1054 has engaged the LGA pad 1076 with a normal force that is sufficient to operate the bare die 1012 under useful field conditions of power and signal transmission. A transfer function has accomplished lifting of the contact tip 1001 by converting a lateral-motion force into a vertical-motion force. For example, a lateral displacement of 0.1 mm may achieve a vertical load of about 5 gf. In another example, a lateral displacement of about 0.25 mm may achieve a vertical load of about 15 gf. In an embodiment, the normal force is in a range from 0.5 gram force (gf) to 20 gf for each contact tip. In an embodiment, the normal force is 15 gf.

As a consequence of the shifting cam plate 1016, a lateral-displacement (X-direction) input has resulted in a vertical-load (Y-direction) output to the contact tip 1001 and the resulting normal force on the LGA pad 1076. The overall package illustrated is static including the contact paddle 1052 and the LGA die package 1014. A normal force is therefore generated in an embodiment by rotation of a rigid body such as a cam screw although other mechanical contrivances may be used to achieve lateral motion of the motion plate 1016. The LGA die package 1014 may have incidental miniscule amounts of bowing in the Z-direction, but it is countered by the primary stiffener and optionally from a secondary stiffener (see FIG. 10e). The positive Z displacement contact also minimizes overdeflection shorting risk with the assembly as the contacts are pushed away from one another.

It may now be understood that the LGA die package socket 1000 is a translational LGA die-package socket, but other methods of achieving a useful positive-Z elevation of the contact tip 1001 may be done to obtain a sufficient normal force with the LGA pads 1076. For example, a worm drive may be used in the place of a cam to obtain translational motion. In an embodiment, the LGA contacts are in maximum torsional stress when in protective cover where the motion plate has an urging shoulder that is on the upper surface of the contact body. The motion plate may be lifted instead of laterally shifted and the contact tip allowed to free-flex toward the LGA pad. In an embodiment, the LGA plate urging shoulder is similarly situated as seen in FIG. 10a, but a lifting motion of the LGA plate is used such that the urging shoulder moves vertically to drive the contact tip into the LGA pad. It may now be seen that a combination of lifting and shifting the motion plate may be done to lift the contact tip into the LGA pad.

The LGA-die socket 1000 is also depicted mounted on a board 1034 such as a motherboard. Mounting is accomplished by seating the contact paddle 1052 onto a bump 1044 such as a solder ball 1044.

Figure 10E:
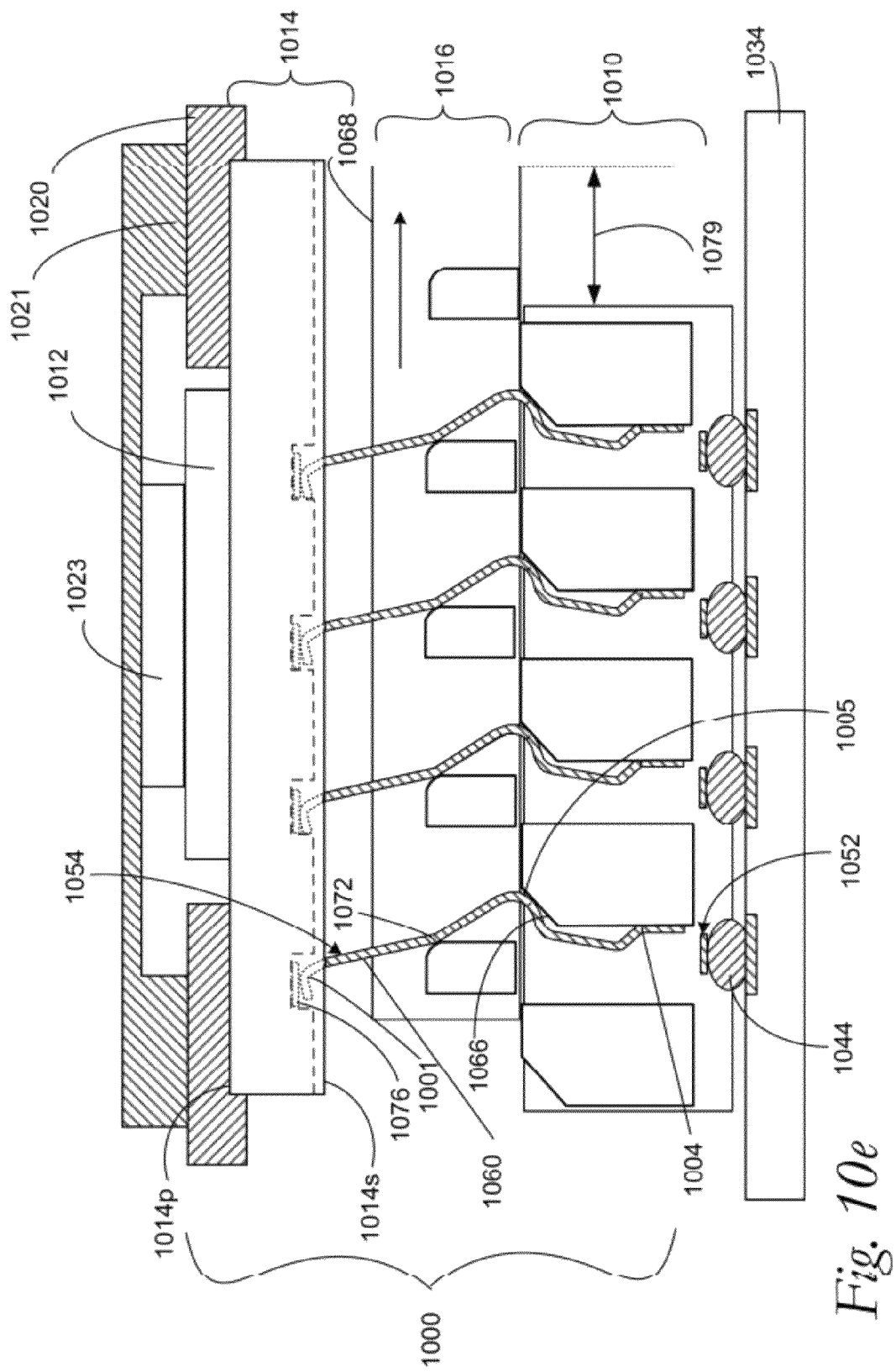
FIG. 10e is a side cut-away elevation of the array of land-grid array contacts depicted in FIG. 10c after further activity according to an example embodiment.

FIG. 10e is a side cut-away elevation of the array of land-grid array contacts depicted in FIG. 10c after further activity according to an example embodiment. In an embodiment, the LGA-die package 1014 is thinner as depicted here, compared to the LGA-die package 1014 depicted in FIG. 10d. In an embodiment, the LGA die package has a nominal substrate Z-height in a range from 0.8 mm to 1.4 mm. In an embodiment, an 8-layer LGA die package 1014 is used with a nominal substrate Z-height to 1.077 mm. In an embodiment, a 10-layer LGA die package 1014 is used with a nominal substrate Z-height to 1.167 mm. In an embodiment, a 10-layer LGA die package 1014 is used with a nominal substrate Z-height to 0.45 mm. Stiffness of the LGA die package 1014 may be in a range from 1 N (Newton)/mm to 6 N/mm. In an embodiment, the LGA die package 1014 is 2.33 N/mm.

Where the socket body 1010 and the cam plate 1016 have standardized dimensions, different thicknesses of LGA-die packages are accommodated by these embodiments. For example, the cam plate 1016 is moved even farther such that the LGA contact body 1052 moves the contact tip 1001 even higher in a positive-Z displacement such that the LGA pad 1076 of a thinner LGA-die package 1014 is contacted with sufficient normal force by the contact tip 1001 that useful field conditions of power and signal management transmission is achieved. In this embodiment, the cam plate 1072 has been shifted sufficiently to the right that both the urging shoulder 1072 and the clearance 1066 have engaged the contact body 1054 to drive the contact tip 1001 into a sufficient positive-Z height to engage the LGA pad 1076. In this embodiment, both the primary pivot area 1004 and the secondary pivot area 1005 experience torsional deflections.

It may now be appreciated that a first LGA-die package of a first thickness may be ZIF assembled to an LGA-die package socket embodiment, followed by field use or testing, and further followed by inserting a second LGA-die package of a second thickness that is different from the first thickness. This embodiment may be useful for upgrading an LGA-die package such as a newer processor that can be used with the existing electronic system. It may now also be understood that two LGA-die packages may be inserted seriatim into an LGA-die package socket embodiment where the first and the second LGA-die packages are the same thickness.

It may now be appreciated that the LGA-die package 1014 may be supported from below solely by the array of LGA contacts at the contact tips.

A secondary stiffener 1021 complements the primary stiffener 1020 and a heat slug 1023 is used both for heat management of the bare die 1012 as well as to facilitate stiffening the LGA-die package 1014 according to an embodiment.

Figure 11:
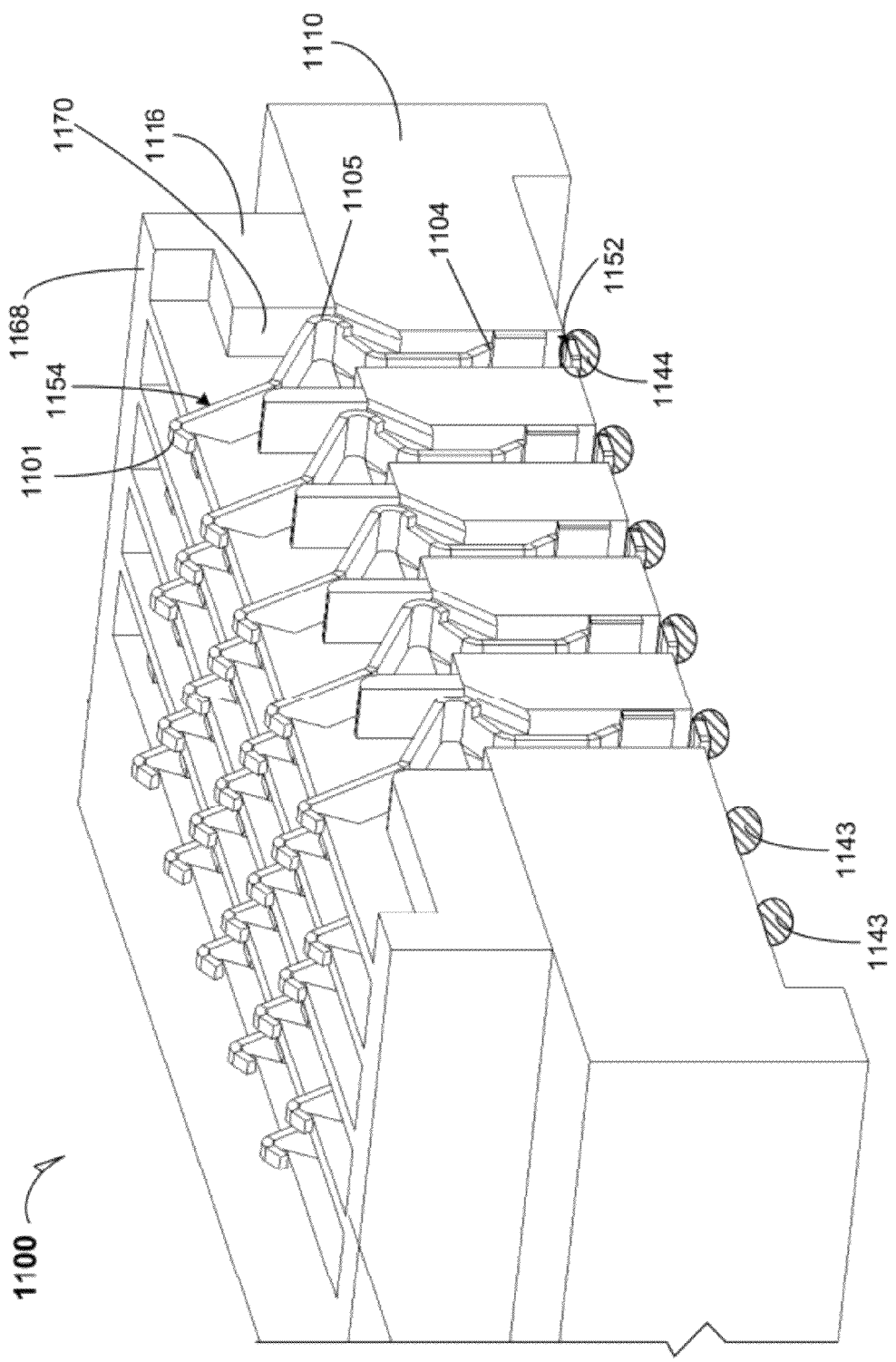
FIG. 11 is a perspective cut-away elevation of a translational land-grid array connector according to an example embodiment.

FIG. 11 is a perspective cut-away elevation of a zero insertion-force translational land-grid array socket 1100 according to an example embodiment. The ZIF TLGA socket 1100 includes a plurality of LGA contact embodiments that have been stitched into a socket body 1110 as well as into a motion plate 1116 such as a cam plate. A contact body 1154 includes primary- and secondary pivot areas 1104 and 1105, respectively and a contact tip 1101 at a first end of LGA contact. A contact paddle 1152 is located at a second end of the LGA contact, and the contact paddle 1152 is located in a region of the socket body 1110 such that a clearance gap is provided for an electrical bump such as the bump 1044 depicted in FIG. 10d.

As illustrated, the contact body 1154 is depicted in a repose state where the contact tip 1101 is disposed above the top surface 1168 of the plate 1116. In an embodiment, the socket body 1110 may have solder bumps 1144 as well as dummy solder bumps 1143 that may assist in handling thermal and physical strain on the socket body 1110 during field use.

Figure 12A:
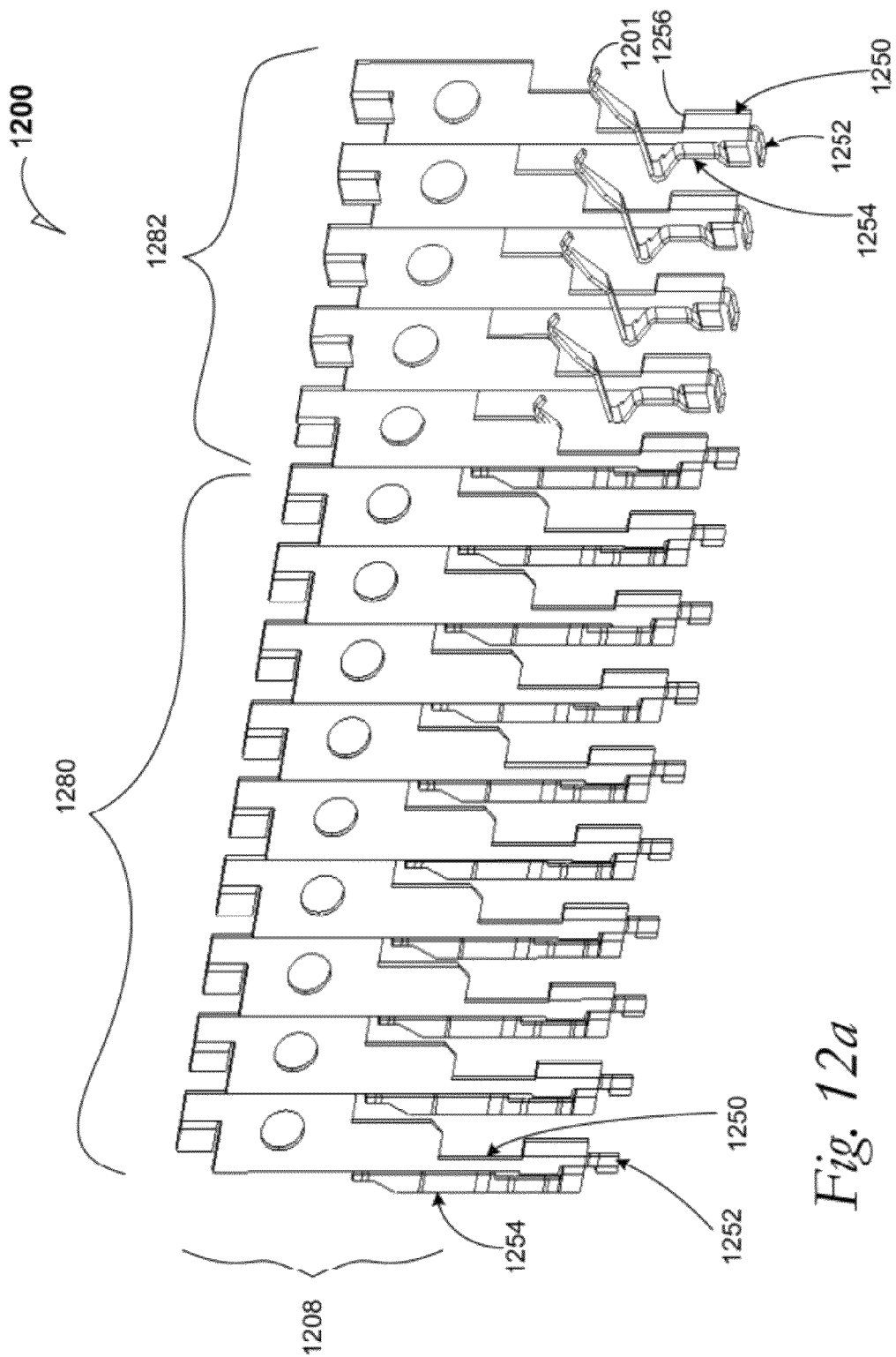
FIG. 12a is a perspective elevation of an array of contacts used in a translational land-grid array connector during processing according to an example embodiment.

FIG. 12a is a perspective elevation of an array of contacts 1200 used in a translational land-grid array socket during processing according to an example embodiment. A carrier 1208 is used during formation of a plurality of LGA contacts.

A stamped-contact gang 1280 illustrates the carrier attach 1250, the contact body 1254, and the contact paddle 1252 before bending portions thereof. These LGA contact components are shown in a stamped configuration while still attached to the carrier 1208. A stitch-ready contact gang 1282 illustrates the carrier attach 1250 with the contact body 1254 and the contact paddle 1252 being bent out of the plane of the carrier attach 1250, as well as the contact body 1254 having other useful bend formations. The carrier attach 1250 has a socket-body plate 1256 and the contact body 1254 is also illustrated at the contact tip 1201.

Figure 12B:
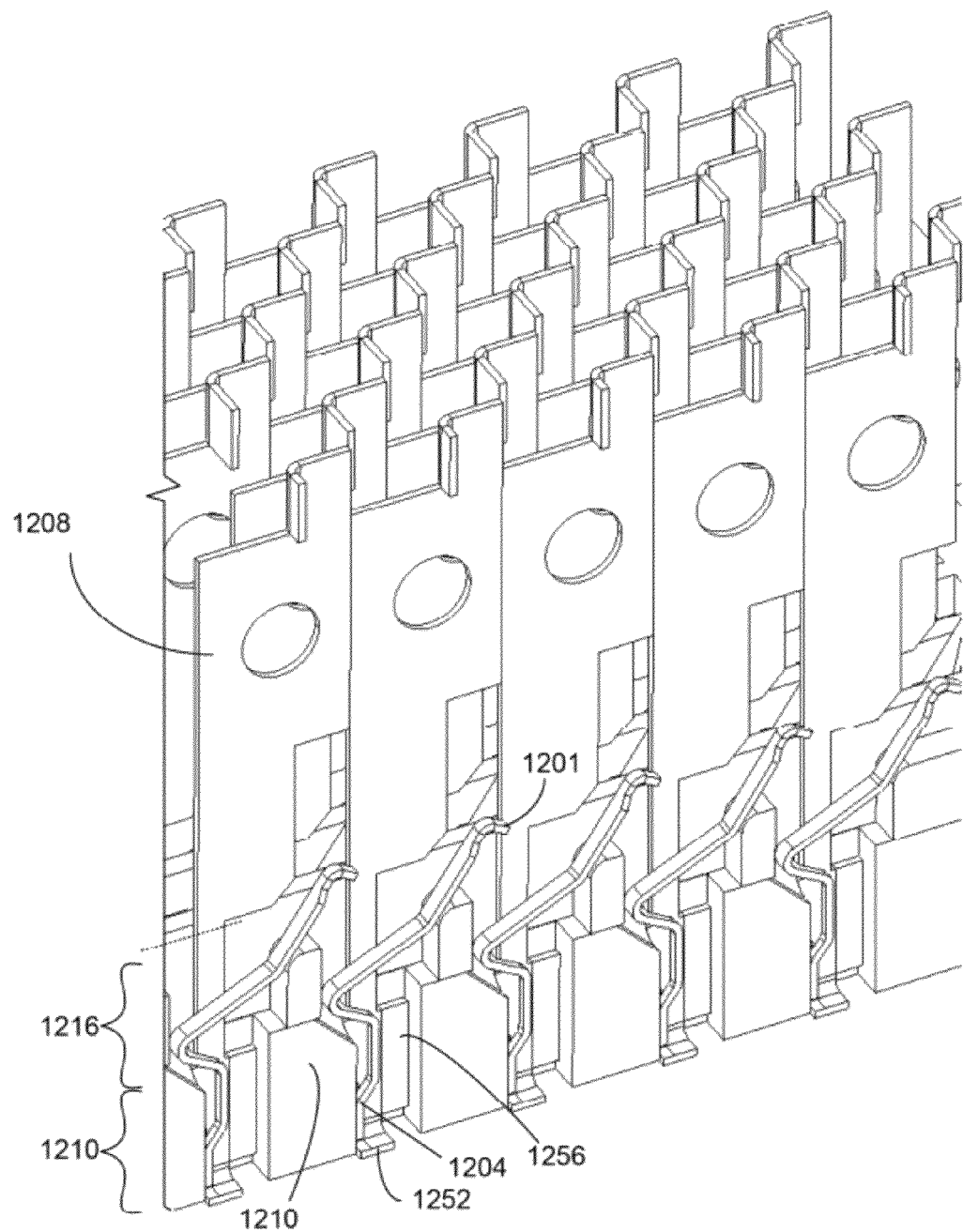
FIG. 12b is a perspective elevation of the array of contacts depicted in FIG. 12a during stitching the array of contacts into a socket body according to an embodiment.

FIG. 12*b* is a perspective elevation of an array of contacts during a stitching process of the array of contacts into a socket body according to an embodiment. Portions of six rows of LGA contact embodiments are depicted being stitched onto a socket body 1210 by use of the carrier 1208. The LGA contacts are also perforating the motion plate 1216. It can be seen that the socket-body plate 1256 has been slip-fit into a portion of the socket body 1210 that secures the LGA contact into position.

Figure 12C:
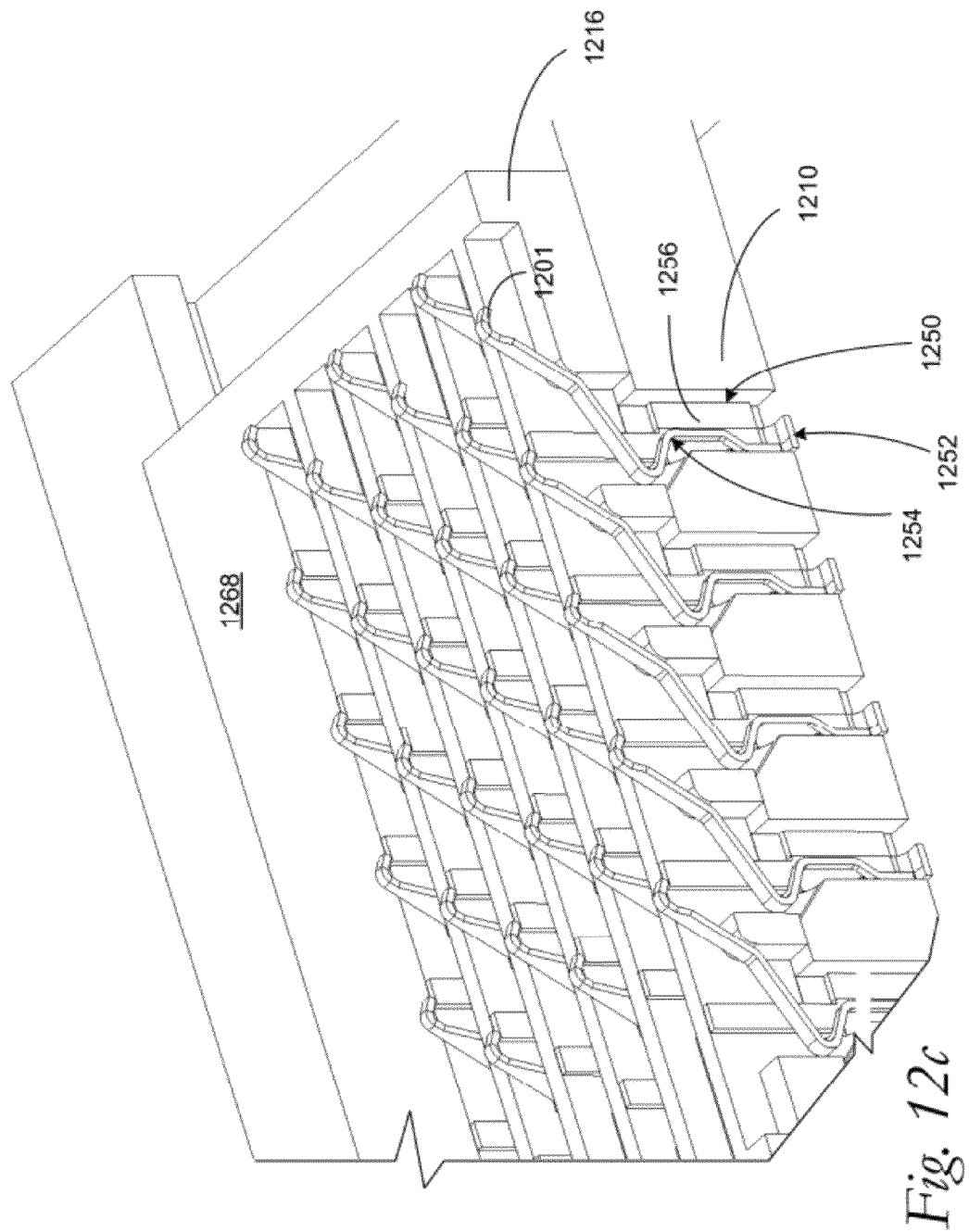
FIG. 12c is a perspective elevation of the stitched array of contacts in the socket body during further processing according to an embodiment.

FIG. 12*c* is a perspective elevation of the stitched array of LGA contacts in the socket body during further processing according to an embodiment. The several carriers have been severed from the plurality of LGA contacts and each LGA contact is seen in a state of repose after having been stitched into place.

FIG. 13*a* is a cut-away perspective elevation 1300 an LGA die-package socket that includes a cam screw 1318 being rotated in a socket body 1310 and translating a motion plate 1316 according to an example embodiment. The socket body 1310 is illustrated cut in half in the Y-direction with one end flange 1326 and additionally a convex fiducial 1349 that is used to mate with a concave fiducial of a die package such as the concave fiducial 448 depicted in FIG. 5. The cam plate 1316 is also engaged with the cam screw 1318 and both engage the socket body 1310. The cam plate 1316 includes an upper surface 1368 below which contact tips are refracted during ZIF assembly of an LGA-die package onto the footprint of the cam plate 1316. Half of the LGA footprint is depicted and delineated at 1317*x*. A cam-screw tab 1319 is part of the cam screw 1318, and it serves to indicate the extent of rotation of the cam screw 1318. In an embodiment, the cam screw 1318 may be rotated though less than 180° to such that the cam plate 1316 translates sufficiently to cause LGA contact tips to engage LGA pads on LGA-die package. For example, the cam screw 1318 may be configured to engage LGA pads of an LGA-die package that is thicker and e.g. a 90° rotation is sufficient. In an embodiment, a 180° rotation is useful to achieve a higher Z-height of LGA contact tips. For example a 180° cam-screw rotation achieves a lateral displacement of the cam plate 1316 of about 0.7 mm.

FIG. 13*b* is a cut-away perspective elevation 1301 of the LGA-die package socket depicted in FIG. 13*a* after further activity according to an embodiment. The cam screw 1318 has been rotated clockwise such that the cam-screw tab 1319 has been moved into the cut-away portion of the illustration. As a result of the rotation, distance 1378 shifted by the cam plate 1316 is sufficient such that contact tips of the plurality of LGA contact bodies have been moved in a useful Z-direction. In an example embodiment, the cam screw 1318 is configured as seen in FIG. 13*a* and the contact tips of a plurality of LGA contact bodies have been lowered into protective cover below the top surface 1368 to facilitate ZIF assembly of an LGA-die package. Further in this example embodiment, the cam screw 1618 is configured as seen in FIG. 13*b* and the contact tips of the plurality of LGA contact bodies have been moved in a positive-Z direction.

Figure 14:
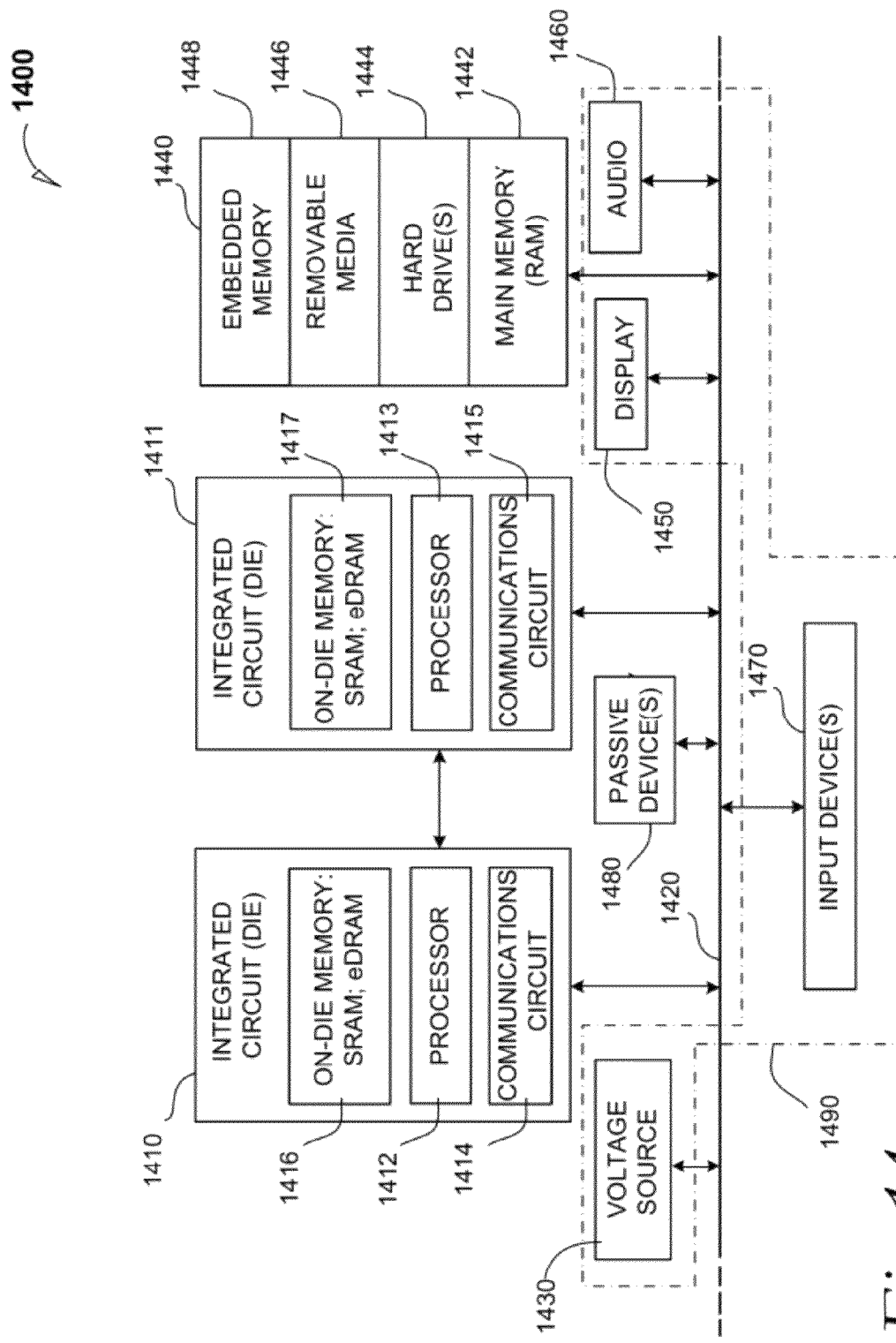
FIG. 14 is a schematic of a computer system according to an embodiment.

FIG. 14 is a schematic of a computer system according to an embodiment. The computer system 1400 (also referred to as the electronic system 1400) as depicted can embody a ZIF-assembled LGA-die package socket according to any of the several disclosed embodiments and their equivalents as set forth in this disclosure. The computer system 1400 may be a mobile device such as a netbook computer. The computer system 1400 may be a mobile device such as a wireless smart phone. The computer system 1400 may be a desktop computer. The computer system 1400 may be a hand-held reader. The computer system 1400 may be integral to an automobile or other vehicle including unmanned. The computer system 1400 may be integral to a television or other communication device such as a flat-panel monitor.

In an embodiment, the electronic system 1400 is a computer system that includes a system bus 1420 to electrically couple the various components of the electronic system 1400. The system bus 1420 is a single bus or any combination of busses according to various embodiments. The electronic system 1400 includes a voltage source 1430 that provides power to the integrated circuit 1410. In some embodiments, the voltage source 1430 supplies current to the integrated circuit 1410 through the system bus 1420.

The integrated circuit 1410 is electrically coupled to the system bus 1420 and includes any circuit, or combination of circuits according to an embodiment. In an embodiment, the integrated circuit 1410 includes a processor 1412 that can be a ZIF-assembled LGA-die package socket embodiment. As used herein, the processor 1412 may mean any type of circuit such as, but not limited to, a microprocessor, a microcontroller, a graphics processor, a digital signal processor, or another processor. In an embodiment, the processor 1412 is disposed in a ZIF-assembled LGA-die package socket embodiment disclosed herein. In an embodiment, SRAM embodiments are found in memory caches of the processor. Other types of circuits that can be included in the integrated circuit 1410 are a custom circuit or an application-specific integrated circuit (ASIC), such as a communications circuit 1414 for use in wireless devices such as cellular telephones, smart phones, pagers, portable computers, two-way radios, and similar electronic systems. In an embodiment, the processor 1410 includes on-die memory 1416 such as static random-access memory (SRAM). In an embodiment, the processor 1410 includes embedded on-die memory 1416 such as embedded dynamic random-access memory (eDRAM).

In an embodiment, the integrated circuit 1410 is complemented with a subsequent integrated circuit 1411 such as the ZIF-assembled die package socket embodiments set forth in this disclosure. In an embodiment, the dual integrated circuit 1410 includes embedded on-die memory 1417 such as eDRAM. The dual integrated circuit 1411 includes an RFIC dual processor 1413 and a dual communications circuit 1415 and dual on-die memory 1417 such as SRAM. The dual communications circuit 1415 is particularly configured for RF processing.

At least one passive device 1480 is coupled to the subsequent integrated circuit 1411 such that the RFIC 1411 and the at least one passive device are part of the any ZIF-assembled LGA-die socket apparatus embodiments.

In an embodiment, the electronic system 1400 also includes an external memory 1440 that in turn may include one or more memory elements suitable to the particular application, such as a main memory 1442 in the form of RAM, one or more hard drives 1444, and/or one or more drives that handle removable media 1446, such as diskettes, compact disks (CDs), digital variable disks (DVDs), flash memory drives, and other removable media known in the art. The external memory 1440 may also be embedded memory 1448 such as a ZIF-assembled LGA-die package socket according to an embodiment.

In an embodiment, the electronic system 1400 also includes a display device 1450, and an audio output 1460. In an embodiment, the electronic system 1400 includes an input device such as a controller 1470 that may be a keyboard, mouse, touch pad, keypad, trackball, game controller, microphone, voice-recognition device, or any other input device that inputs information into the electronic system 1400. In an embodiment, an input device 1470 includes a camera. In an embodiment, an input device 1470 includes a digital sound recorder. In an embodiment, an input device 1470 includes a camera and a digital sound recorder.

A foundation substrate 1490 may be part of the computing system 1400. In an embodiment, the foundation substrate 1490 is a motherboard that holds a ZIF-assembled LGA-die package socket embodiment. In an embodiment, the foundation substrate 1490 is a board onto which a ZIF-assembled LGA-die package socket embodiment is mounted. In an embodiment, the foundation substrate 1490 incorporates at least one of the functionalities encompassed within the dashed line 1490 and is a substrate such as the user shell of a mobile device such as a laptop computer. In an embodiment, the foundation substrate 1490 incorporates at least one of the functionalities encompassed within the dashed line 1490 and is a substrate such as the user shell of a mobile device such as a hand-held communicator.

As shown herein, the integrated circuit 1410 can be implemented in a number of different embodiments, including a ZIF-assembled LGA-die package socket according to any of the several disclosed embodiments and their equivalents, an electronic system, a computer system, one or more methods of fabricating an integrated circuit, and one or more methods of fabricating an electronic assembly that a ZIF-assembled chip apparatus according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration a ZIF-assembled chip apparatus according to any of the several disclosed ZIF-assembled LGA-die package socket embodiments and their equivalents.

Figure 15A:
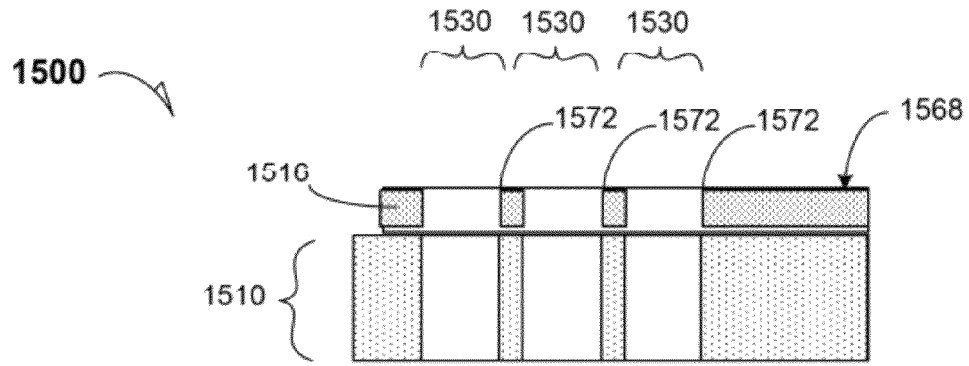
FIG. 15a is a cross-section elevation of a low insertion-force land-grid array die socket according to an example embodiment.

FIG. 15*a* is a cross-section elevation of a low insertion-force land-grid array die socket according to an example embodiment. A socket body 1510 includes a contact slot 1530 that also is formed in a motion plate 1516. In an embodiment, the motion plate 1516 is a cam plate. The motion plate 1516 has a plurality of urging shoulders 1572 to match the plurality of contact slots. In an embodiment, the width of each contact slot 1530 may be tailored to allow varying normal forces by selected LGA contacts according to useful applications. The motion plate 1516 also has an upper surface 1568.

Figure 15B:
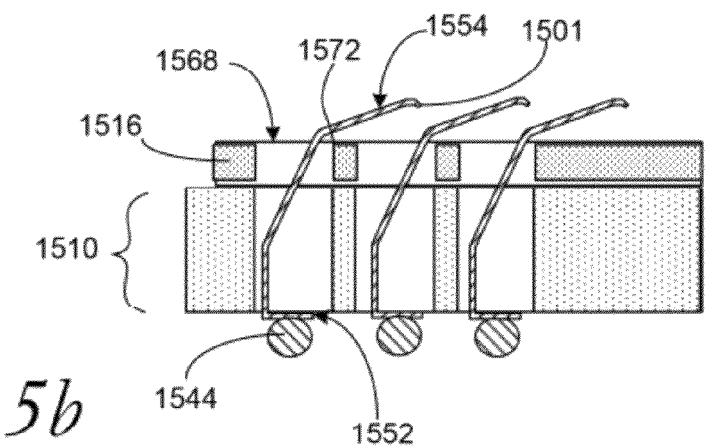
FIG. 15b is a cross-section elevation of the low insertion-force land-grid array die socket depicted in FIG. 15a after further activity according to an embodiment.

FIG. 15*b* is a cross-section elevation of the low insertion-force land-grid array die socket depicted in FIG. 15*a* after further activity according to an embodiment. A plurality of LGA contacts 1554 has been stitched into the plurality of contact slots 1530. Also, a plurality of electrical bumps 1544 have been attached to contact paddles 1552.

Figure 15C:
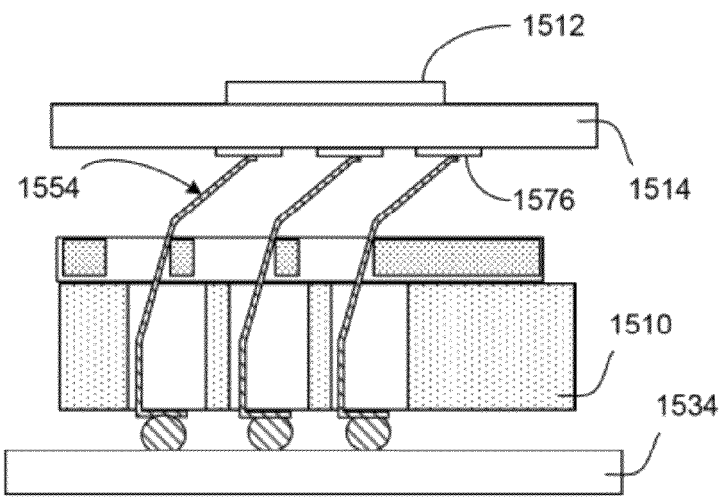
FIG. 15c is a cross-section elevation of the low insertion-force land-grid array die socket depicted in FIG. 15b after further activity according to an embodiment.

FIG. 15*c* is a cross-section elevation of the low insertion-force land-grid array die socket depicted in FIG. 15*b* after further activity according to an embodiment. The motion plate 1516 has been translated to the left such that the urging shoulders 1572 (see FIG. 15*a*) have engaged the LGA contacts 1554 and a positive-Z displacement has been achieved on the LGA contact tips 1501. As depicted, the LGA contact tips 1501 have engaged a plurality of LGA pads 1576 that are part of an LGA die package 1514. The contact tips 1501 engage the LGA pads 1576 with a normal force that is sufficient to operate the bare die 1512 under useful field conditions of power and signal transmission. A transfer function has accomplished lifting of the contact tip 1501 by converting a lateral-motion force into a vertical-motion force. For example, a lateral displacement of 0.1 mm may achieve a vertical load of about 5 gf. In another example, a lateral displacement of about 0.25 mm may achieve a vertical load of about 15 gf. In an embodiment, the normal force is in a range from 0.5 gf to 20 gf for each contact tip. In an embodiment, the normal force is 15 gf.

As a consequence of the shifting motion plate 1516, a lateral-displacement (X-direction) input has resulted in a vertical-load (Y-direction) output to the contact tip 1501 and the resulting normal force on the LGA pad 1576. The overall package illustrated is static including the contact paddle 1552 and the LGA die package 1514. A normal force is therefore generated in an embodiment by rotation of a rigid body such as a cam screw although other mechanical contrivances may be used to achieve lateral motion of the motion plate 1516. The LGA die package 1514 may have incidental miniscule amounts of bowing in the Z-direction, but it is countered by a primary stiffener and optionally from a secondary stiffener (see e.g., FIG. 10*e*).

It may now be understood that the LGA die package socket 1500 is a translational LGA die-package socket, but other methods of achieving a useful positive-Z elevation of the contact tip 1001 may be done to obtain a sufficient normal force with the LGA pads 1576. For example, a worm drive may be used in the place of a cam to obtain translational motion. In an embodiment, the LGA contacts are in maximum torsional stress when in protective cover where the motion plate has an urging shoulder that is on the upper surface of the contact body. The motion plate may be lifted instead of laterally shifted and the contact tip allowed to free-flex toward the LGA pad. In an embodiment, the LGA plate urging shoulder is similarly situated as seen in FIG. 10*a*, but a lifting motion of the LGA plate is used such that the urging shoulder moves vertically to drive the contact tip into the LGA pad. It may now be seen that a combination of lifting and shifting the motion plate may be done to lift the contact tip into the LGA pad.

The LGA-die socket 1500 is also depicted mounted on a board 1534 such as a motherboard. Mounting is accomplished by seating the contact paddle 1552 onto a bump 1544 such as a solder ball 1544.

Although a die may refer to a processor chip, an RF chip, an RFIC chip, integrated passive device (IPD) chip, or a memory chip may be mentioned in the same sentence, but it should not be construed that they are equivalent structures. Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" "above" and "below" may be understood by reference to the illustrated X-Z coordinates, and terms such as "adjacent" may be understood by reference to X-Y coordinates or to non-Z coordinates.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A die-package socket, comprising:
   a socket body;
   a cam plate slidingly coupled to the socket body, wherein the cam plate includes a footprint for a semiconductive device, wherein the cam plate includes a plurality of contact slots within the footprint;
   a plurality of LGA contacts affixed to the socket body, wherein the plurality of LGA contacts penetrates the cam plate through the plurality of contact slots; and
   a cam screw rotatingly coupled to the cam plate and affixed to the socket body;
   wherein each LGA contact includes:
   an LGA contact body including a tip at a first end of the LGA contact;
   a contact paddle at a second end of the LGA contact; and
   a plate affixed to the socket body and adjacent the contact paddle.

2. The die-package socket of claim 1, wherein each LGA contact body further includes:
   a tip-raising contact-input section adjacent the tip, wherein the tip-raising contact input section has a substantially rectilinear shape;
   a tip-lowering contact-input section adjacent the tip-raising input section, wherein the tip-lowering input section has a substantially curvilinear shape.

3. The die-package socket of claim 1, further including a primary stiffener that is configured to lock onto the socket body and that encloses the cam plate.

4. The die-package socket of claim 1, further including:
   a primary stiffener that is configured to lock onto the socket body and that encloses the cam plate; and
   a secondary stiffener that is coupled to the primary stiffener.

5. The die-package socket of claim 1, wherein the contact paddle is compliantly integral to the plate.

6. The die-package socket of claim 1, wherein the LGA contact body includes a primary pivot area that is also disposed adjacent the plate, wherein the primary pivot area has a medium dimension that is orthogonal to the plate.

7. The die-package socket of claim 1, wherein the cam plate includes a plurality of array prominences each of which defines a boundary between two adjacent rows of LGA contact slots, and wherein each array prominence is configured to have a Z-height sufficient to match the contact head of each LGA contact affixed adjacent thereto when each LGA contact is in a zero-insertion force (ZIF) configuration.

8. The die-package socket of claim 1, further including the semiconductive device disposed on a first surface of a LGA-die package, and wherein the LGA-die package includes an LGA configured on a second side of the LGA-die package that is parallel planar with the first side, and wherein the LGA mates to the plurality of LGA contacts at the LGA contact tips.

9. The die-package socket of claim 1, wherein each LGA contact body further includes:
   a tip-raising contact-input section adjacent the tip, wherein the tip-raising contact input section has a substantially rectilinear shape; and
   a tip-lowering contact-input section adjacent the tip-raising input section, wherein the tip-lowering input section has a substantially curvilinear shape;
   wherein the socket body includes an urging seat that is configured to contact the tip-lowering contact-input section;
   wherein the cam plate includes an urging wall that is configured to contact the tip-lowering contact-input section; and
   wherein the cam plate also includes an urging shoulder that is configured to contact the tip-raising contact-input section.

10. The die-package socket of claim 1, further including:
    a land-grid array die package including a die side and a land side, wherein the land side includes a land-grid array of pads; and
    a bare die disposed on the die side and electrically coupled to the land-grid array.

11. The die-package socket of claim 1, further including:
    a land-grid array die package including a die side and a land side, wherein the land side includes a land-grid array of pads; and
    a die disposed on the die side and electrically coupled to the land-grid array.

12. The die-package socket of claim 1, wherein the plurality of LGA contacts are affixed to the socket body though a plurality of contact slots in the cam plate, and wherein a first contact slot has a first dimension and a subsequent cam slot has a second dimension that is larger than the first dimension.

13. A computer system comprising:
    a die-package socket, including:
    a socket body;
    a cam plate slidingly coupled to the socket body, wherein the cam plate includes a footprint for a semiconductive device, wherein the cam plate includes a plurality of contact slots within the footprint;
    a plurality of LGA contacts affixed to the socket body, wherein the plurality of LGA contacts penetrates the cam plate through the plurality of contact slots; and a cam screw rotatingly coupled to the cam plate and affixed to the socket body;
    wherein each LGA contact includes:
    an LGA contact body including a tip at a first end of the LGA contact;
    a contact paddle at a second end of the LGA contact; and
    a plate affixed to the socket body and adjacent the contact paddle;
    an LGA die package disposed upon the cam plate, wherein the LGA die package includes a die on a first side thereof and plurality of LGA pads on a second side thereof; and
    a foundation substrate onto which the LGA-die socket is mounted.

14. The computer system of claim 13, wherein the foundation substrate is part of a mobile device.

15. The computer system of claim 13, wherein the foundation substrate is part of a vehicle.

16. The computer system of claim 13, wherein the foundation substrate is part of a television.

* * * * *